(12) United States Patent
Jin

(10) Patent No.: US 11,171,173 B2
(45) Date of Patent: Nov. 9, 2021

(54) IMAGE SENSORS

(71) Applicant: Samsung Electronics Co., Ltd., Suwon-si (KR)

(72) Inventor: Younggu Jin, Suwon-si (KR)

(73) Assignee: Samsung Electronics Co., Ltd.

( * ) Notice: Subject to any disclaimer, the term of this patent is extended or adjusted under 35 U.S.C. 154(b) by 53 days.

(21) Appl. No.: 16/519,554

(22) Filed: Jul. 23, 2019

(65) Prior Publication Data
US 2020/0203416 A1 Jun. 25, 2020

(30) Foreign Application Priority Data
Dec. 20, 2018 (KR) .................. 10-2018-0166111

(51) Int. Cl.
*H01L 27/146* (2006.01)
*H04N 5/357* (2011.01)
*H04N 5/378* (2011.01)

(52) U.S. Cl.
CPC .... *H01L 27/14641* (2013.01); *H01L 27/1464* (2013.01); *H01L 27/14607* (2013.01); *H01L 27/14643* (2013.01); *H04N 5/3575* (2013.01); *H04N 5/378* (2013.01)

(58) Field of Classification Search
CPC ......... H01L 27/14641; H01L 27/14643; H01L 27/14614; H01L 31/113
See application file for complete search history.

(56) References Cited

U.S. PATENT DOCUMENTS

| | | | |
|---|---|---|---|
| 7,593,049 B2 | 9/2009 | Sekine | |
| 7,843,029 B2 | 11/2010 | Kawahito et al. | |
| 8,159,584 B2 | 4/2012 | Iwabuchi et al. | |
| 8,513,709 B2 * | 8/2013 | Jin | H04N 5/3741 257/215 |
| 8,520,104 B2 | 8/2013 | Fossum et al. | |
| 9,001,245 B2 | 4/2015 | Wang et al. | |
| 2019/0148448 A1 * | 5/2019 | Lee | H01L 27/14607 257/431 |
| 2019/0281241 A1 | 9/2019 | Jin et al. | |

* cited by examiner

*Primary Examiner* — Phat X Cao
(74) *Attorney, Agent, or Firm* — Myers Bigel, P.A.

(57) ABSTRACT

Image sensors are provided. Image sensors may include unit pixels arranged in a first direction and a second direction crossing the first direction. Each of the unit pixels may include first and second floating diffusion regions and first and second photo gate electrodes between the first and second floating diffusion regions. The unit pixels may include a first unit pixel, a second unit pixel, and a third unit pixel sequentially arranged. The first floating diffusion region of the second unit pixel may be between the first photo gate electrode of the first unit pixel and the first photo gate electrode of the second unit pixel, and the second floating diffusion region of the second unit pixel may be between the second photo gate electrode of the second unit pixel and the second photo gate electrode of the third unit pixel.

19 Claims, 28 Drawing Sheets

IMAGE SENSORS

CROSS-REFERENCE TO RELATED APPLICATION

This U.S. non-provisional patent application claims priority under 35 U.S.C. § 119 to Korean Patent Application No. 10-2018-0166111, filed on Dec. 20, 2018, in the Korean Intellectual Property Office, the entire contents of which are hereby incorporated by reference.

FIELD

The present disclosure relates to an image sensor, and in particular, to an image sensor realizing a three-dimensional image.

BACKGROUND

An image sensor is an electronic device that converts optical images into electrical signals. With the recent development of the computer and communication industries, there is an increased demand for high-performance image sensors in a variety of applications such as digital cameras, camcorders, personal communication systems, gaming machines, security cameras, micro-cameras for medical applications, and/or robots. In addition, image sensors for realizing three-dimensional and/or color images are recently being developed.

SUMMARY

Some embodiments of the inventive concept provide an image sensor with a higher integration density.

According to some embodiments of the inventive concept, image sensors may include a plurality of unit pixels arranged in a first direction and a second direction crossing the first direction. Each of the plurality of unit pixels may include first and second floating diffusion regions and first and second photo gate electrodes between the first and second floating diffusion regions. The plurality of unit pixels may include a first unit pixel, a second unit pixel, and a third unit pixel sequentially arranged, and the second unit pixel is between the first unit pixel and the third unit pixel. The first floating diffusion region of the second unit pixel may be between the first photo gate electrode of the first unit pixel and the first photo gate electrode of the second unit pixel, and the second floating diffusion region of the second unit pixel may be between the second photo gate electrode of the second unit pixel and the second photo gate electrode of the third unit pixel.

According to some embodiments of the inventive concept, image sensors may include a plurality of unit pixels arranged in a first direction and a second direction crossing the first direction. Each of the plurality of unit pixels may include first and second floating diffusion regions spaced apart from each other in a third direction that is diagonal to the first and second directions and first and second photo gate electrodes between the first and second floating diffusion regions. The first and second photo gate electrodes may be spaced apart from each other in the third direction.

According to some embodiments of the inventive concept, image sensors may include a plurality of unit pixels arranged in a first direction and a second direction crossing the first direction. Each of the plurality of unit pixels may include first and second floating diffusion regions spaced apart from each other in a third direction that is diagonal to the first and second direction and first and second photo gate electrodes between the first and second floating diffusion regions. The first and second photo gate electrodes may be spaced apart from each other in the third direction. The plurality of unit pixels may include first and second unit pixels that are directly adjacent to each other in the first direction, and the first and second unit pixels may be mirror-symmetric to each other with respect to an imaginary line extending in the second direction.

BRIEF DESCRIPTION OF THE DRAWINGS

Example embodiments will be more clearly understood from the following description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concept will now be described more fully with reference to the accompanying drawings, in which example embodiments are shown.

Figure 1:
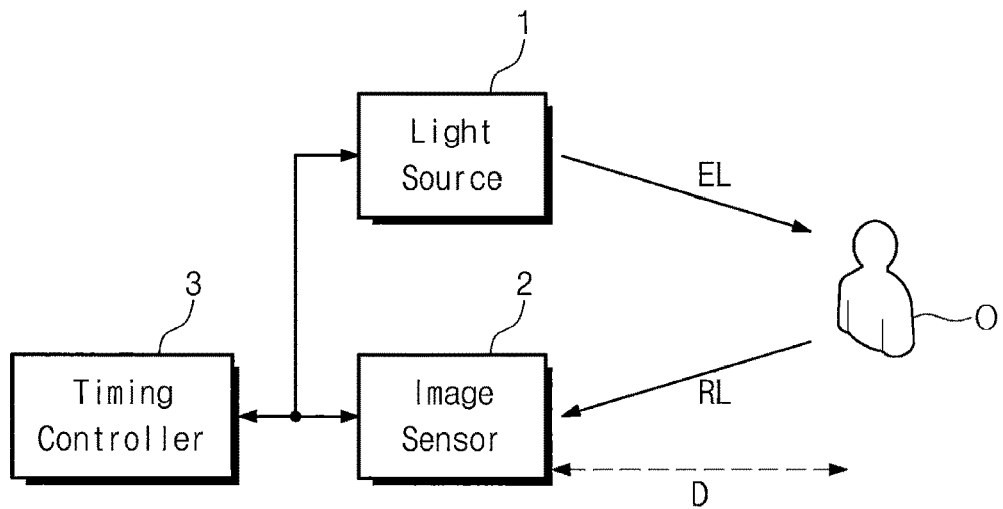
FIG. 1 is a diagram schematically illustrating an image sensor system according to some embodiments of the inventive concept.

FIG. 1 is a diagram schematically illustrating an image sensor system according to some embodiments of the inventive concept.

Referring to FIG. 1, an image sensor system according to some embodiments of the inventive concept may be configured to irradiate light to an object O, to sense light reflected from the object O, and to calculate an optical depth or distance D to the object O. The image sensor system may include a light source 1 sending (e.g., generating) light to the object O, an image sensor 2 sensing light reflected from the object O and a timing controller 3 configured to provide a synchronization signal to the light source 1 and the image sensor 2.

The light source 1 may be configured to emit an optical signal EL, which is a pulsed optical signal, to the object O. In some embodiments, the light source 1 may be configured to emit infrared, microwave, and/or visible light. A light emitting diode (LED), a laser diode (LD) or an organic light emitting diode (OLED) may be used as the light source 1.

The image sensor 2 may be configured to sense light RL reflected from the object O and to output information on an optical depth to the object O. The optical depth information obtained by the image sensor 2 may be used to realize a three-dimensional image, as in an infrared camera. Furthermore, the image sensor 2 may include depth pixels and visible light pixels, and thus, the image sensor 2 may be used to realize three-dimensional color images.

The timing controller 3 may control operations of the light source 1 and the image sensor 2. For example, the timing controller 3 may be configured to synchronize a light-emitting operation of the light source 1 with a light-sensing operation of the image sensor 2.

Figure 2:
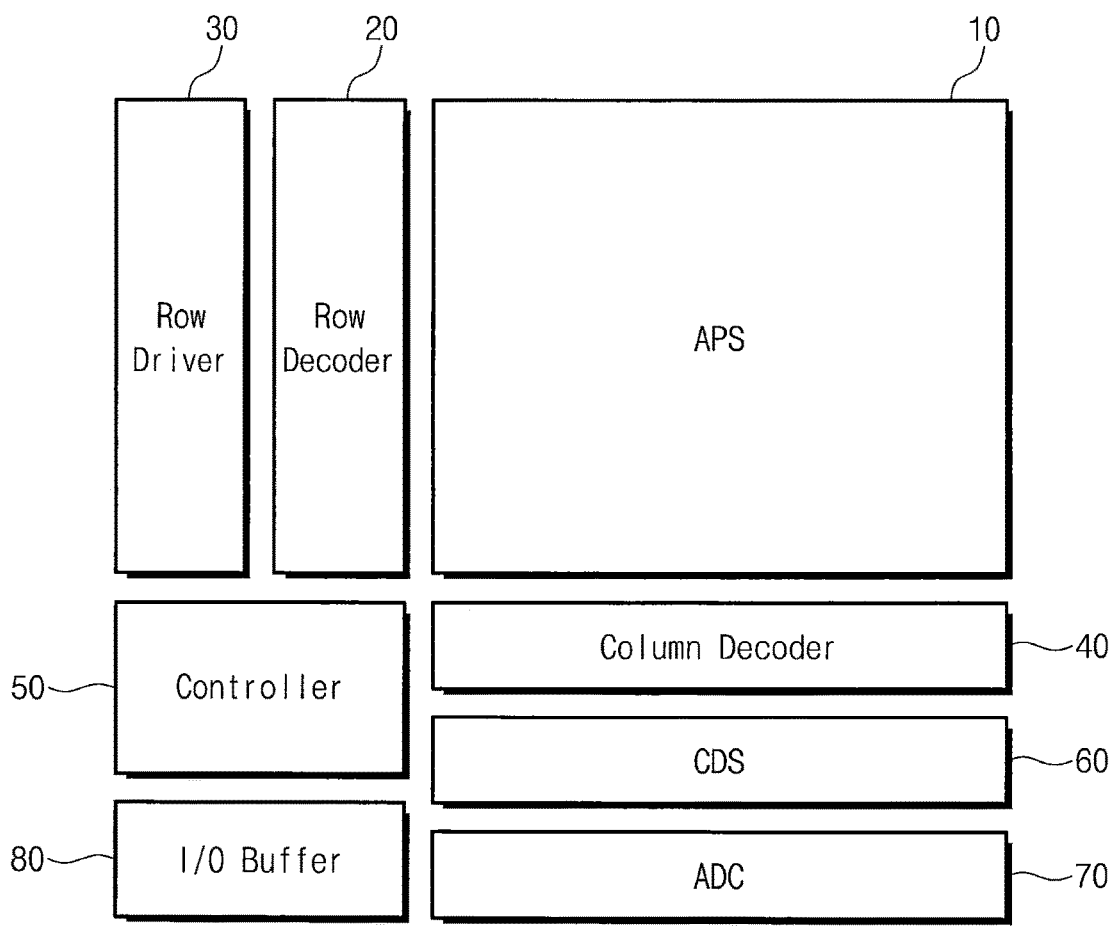
FIG. 2 is a block diagram illustrating an image sensor according to some embodiments of the inventive concept.

FIG. 2 is a block diagram illustrating an image sensor according to some embodiments of the inventive concept.

Referring to FIG. 2, the image sensor may include an active pixel sensor (APS) array 10, a row decoder 20, a row driver 30, a column decoder 40, a controller 50, a correlated double sampler (CDS) 60, an analog-to-digital converter (ADC) 70, and an input/output buffer (I/O buffer) 80.

The active pixel sensor array 10 may include a plurality of unit pixels, which are two-dimensionally arranged, and may be used to convert optical signals to electrical signals. The active pixel sensor array 10 may be driven by a plurality of driving signals (e.g., pixel-selection signals, reset signals, and charge-transfer signals), which are transmitted from the row driver 30. The electrical signals converted by the active pixel sensor array 10 may be provided to the correlated double sampler 60.

The row driver 30 may be configured to generate driving signals for driving the unit pixels, based on information decoded by the row decoder 20, and then to transmit the driving signals to the active pixel sensor array 10. When the unit pixels are arranged in a matrix form (i.e., in rows and columns), the driving signals may be provided to respective rows.

The controller 50 may control an overall operation of the image sensor and may provide timing and control signals to the row decoder 20 and the column decoder 40.

The CDS 60 may be configured to receive the electric signals generated by the active pixel sensor array 10 and then to perform an operation of holding and sampling the received electric signals. For example, the CDS 60 may perform a double sampling operation on a specific noise level and a signal level of the electric signal and then may output a difference level corresponding to a difference between the noise and signal levels.

The ADC 70 may be configured to convert an analog signal, which contains information on the difference level outputted from the CDS 60, to a digital signal and then to output the digital signal.

The I/O buffer 80 may be configured to latch the digital signals and then to output the latched digital signals to an image signal processing unit (not shown) sequentially, based on information decoded by the column decoder 40.

Figure 3A:
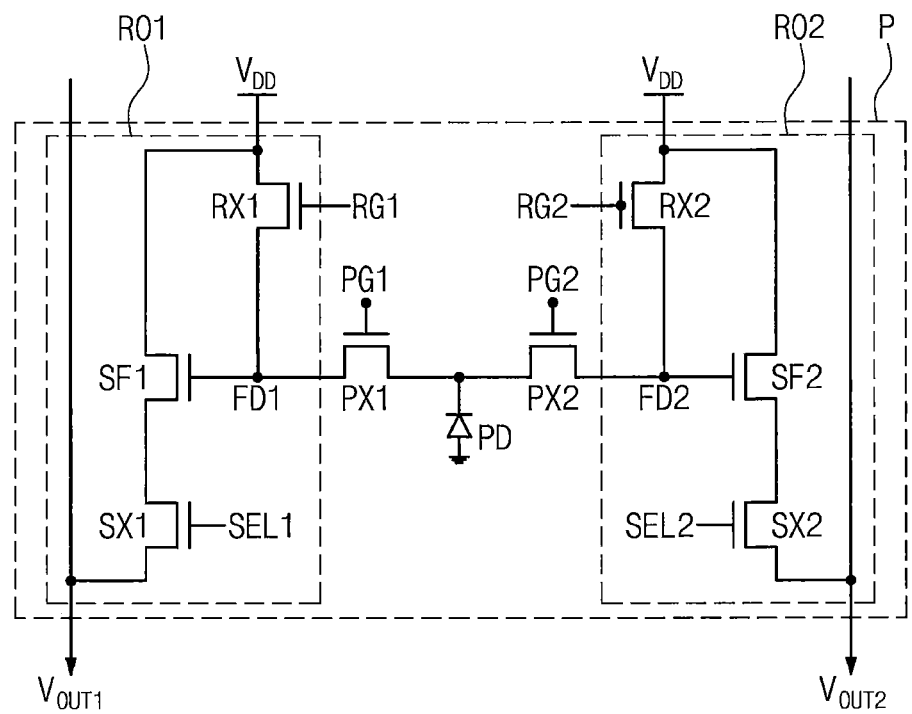
FIG. 3A is a circuit diagram illustrating a unit pixel of an image sensor according to some embodiments of the inventive concept.

FIG. 3A is a circuit diagram illustrating a unit pixel of an image sensor according to some embodiments of the inventive concept.

Referring to FIG. 3A, a unit pixel P may include a photoelectric conversion device PD, first and second photo transistors PX1 and PX2, a first readout circuit RO1 connected to the first photo transistor PX1, and a second readout circuit RO2 connected to the second photo transistor PX2. The first readout circuit RO1 may include a first reset transistor RX1, a first amplification transistor SF1, and a first selection transistor SX1. The second readout circuit RO2 may include a second reset transistor RX2, a second amplification transistor SF2, and a second selection transistor SX2. It will be understood that "connected to" may refer to "electrically connected to."

The first and second photo transistors PX1 and PX2 may share one photoelectric conversion device PD. The photoelectric conversion device PD may be configured to generate electric charges from incident light (e.g., in response to incident light) and to store the generated electric charges. The incident light incident into the unit pixel P may be the light RL reflected by the object O, as described with reference to FIG. 1. The photoelectric conversion device PD may be provided in the form of a photo diode, a photo transistor, a photo gate, a pinned photo diode, or any combination thereof. For the sake of simplicity, the description that follows will refer to an example, in which a photo diode is used as the photoelectric conversion device PD.

The first photo transistor PX1 may be disposed between and electrically connected to a first charge detection node FD1 and the photoelectric conversion device PD. The second photo transistor PX2 may be disposed between and electrically connected to a second charge detection node FD2 and the photoelectric conversion device PD. The first photo transistor PX1 may be controlled by a first photo control signal applied to a first photo gate electrode PG1, and the second photo transistor PX2 may be controlled by a second photo control signal applied to a second photo gate electrode PG2. The first photo control signal applied to the first photo gate electrode PG1 may be provided to have a phase difference of 180° with respect to the second photo control signal applied to the second photo gate electrode PG2. The first and second photo transistors PX1 and PX2 may transfer electric charges, produced by the photoelectric conversion device PD, to the first or second charge detection nodes FD1 and FD2, respectively. The electric charges may be stored or accumulated in the first and second charge detection nodes FD1 and FD2 and may be used to control operations of the first and second amplification transistors SF1 and SF2. It will be understood that the first and second photo transistors PX1 and PX2 may control transfer of electric charges produced by the photoelectric conversion device PD to the first or second charge detection nodes FD1 and FD2.

The first and second reset transistors RX1 and RX2 may discharge charges periodically from the first and second charge detection nodes FD1 and FD2, respectively. The first and second reset transistors RX1 and RX2 may include sources, which are respectively connected to the first and second charge detection nodes FD1 and FD2, and drains, which are connected to a power voltage VDD.

The first and second reset transistors RX1 and RX2 may be controlled by first and second reset signals applied to first and second reset gate electrodes RG1 and RG2, respectively. If the first reset transistor RX1 is turned-on by the first reset signal applied to the first reset gate electrode RG1, the power voltage VDD applied to the drain of the first reset transistor RX1 may be applied to the first charge detection node FD1 to discharge electric charges accumulated in the first charge detection node FD1. If the second reset transistor RX2 is turned-on by the second reset signal applied to the second reset gate electrode RG2, the power voltage VDD connected to the drain of the second reset transistor RX2 may be applied to the second charge detection node FD2 to discharge electric charges accumulated in the second charge detection node FD2.

Each of the first and second amplification transistors SF1 and SF2 may constitute a source follower buffer amplifier, which is configured to generate a source-drain current in proportion to an amount of photocharges, which are input to its gate electrode thereof.

The first amplification transistor SF1 may be controlled by an electric potential of the first charge detection node FD1. A drain of the first amplification transistor SF1 may be connected to the power voltage VDD, and a source of the first amplification transistor SF1 may be connected to a drain of the first selection transistor SX1. The first amplification transistor SF1 may be configured to amplify a change in electric potential of the first charge detection node FD1 and to output the amplified or first pixel signal to a first output line VOUT1 through the first selection transistors SX1.

The second amplification transistor SF2 may be controlled by an electric potential of the second charge detection node FD2. A drain of the second amplification transistor SF2 may be connected to the power voltage VDD, and a source of the second amplification transistor SF2 may be connected to a drain of the second selection transistor SX2. The second amplification transistor SF2 may be configured to amplify a change in electric potential of the second charge detection node FD2 and to output the amplified or second pixel signal to a second output line VOUT2 through the second selection transistors SX2.

The first and second selection transistors SX1 and SX2 may be controlled by first and second selection signals applied to first and second selection gate electrodes SEL1 and SEL2, respectively, and when the first and second selection transistors SX1 and SX2 are turned on, the signals amplified by the first and second amplification transistors SF1 and SF2 may be output through the first and second output lines Vout1 and Vout2. Information on a difference between signals output from the first and second output lines Vout1 and Vout2 may be obtained by a signal processing unit and this information may be used to obtain information on a depth or distance to the object.

Figure 3B:
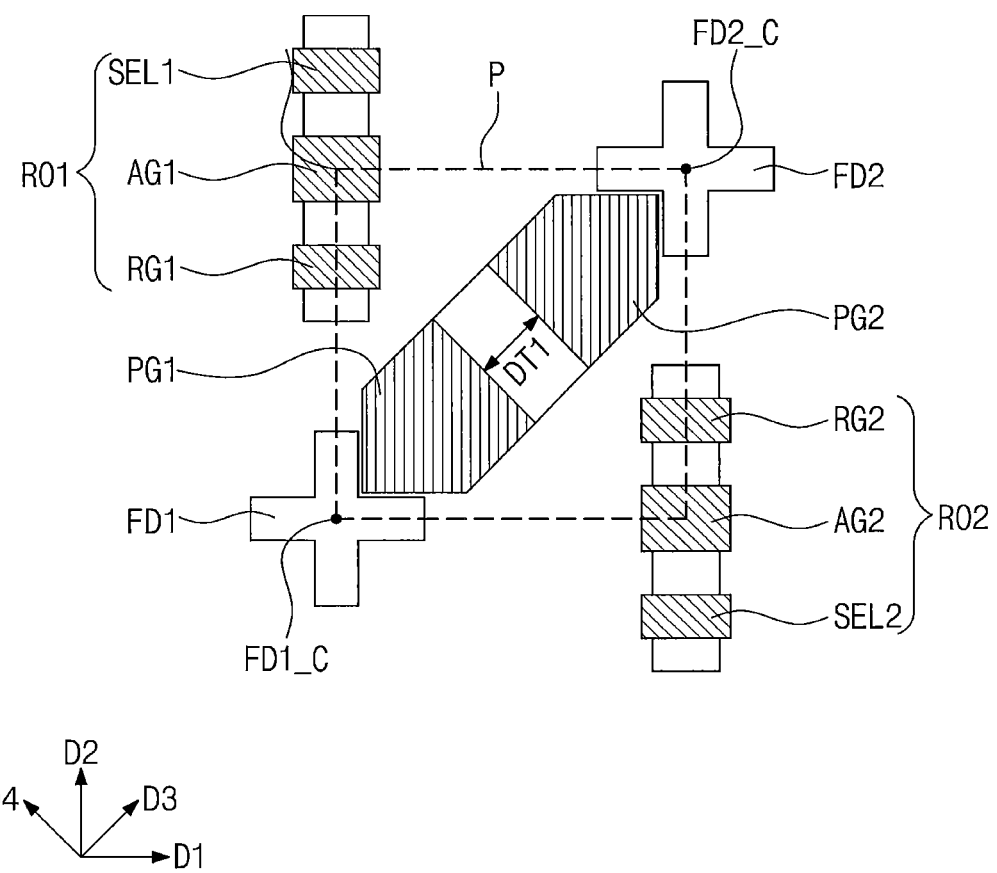
FIG. 3B is a plan view illustrating a unit pixel of an image sensor according to some embodiments of the inventive concept.
Figure 3C:
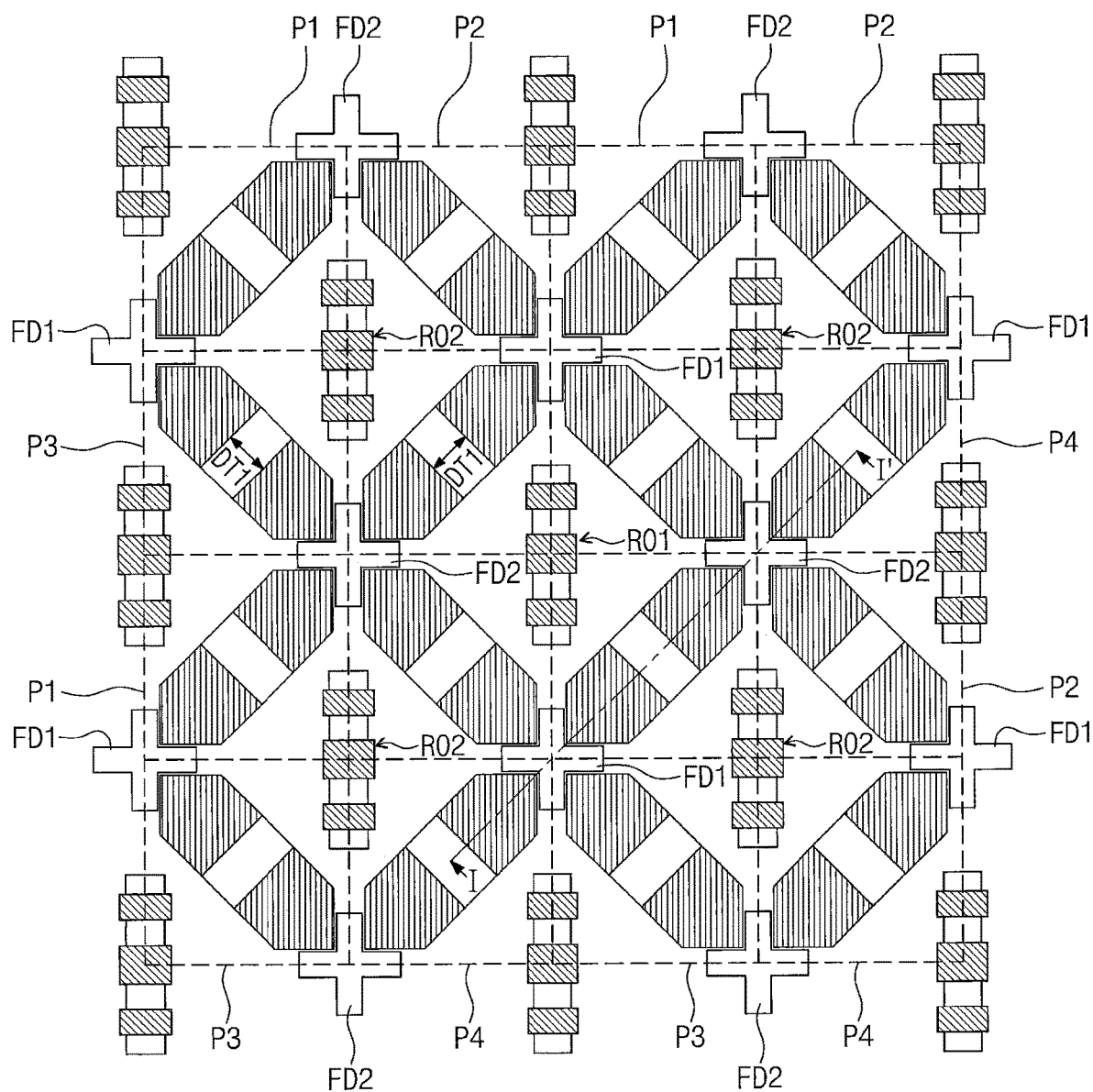
FIG. 3C is a plan view illustrating a pixel array of an image sensor according to some embodiments of the inventive concept.
Figure 3D:
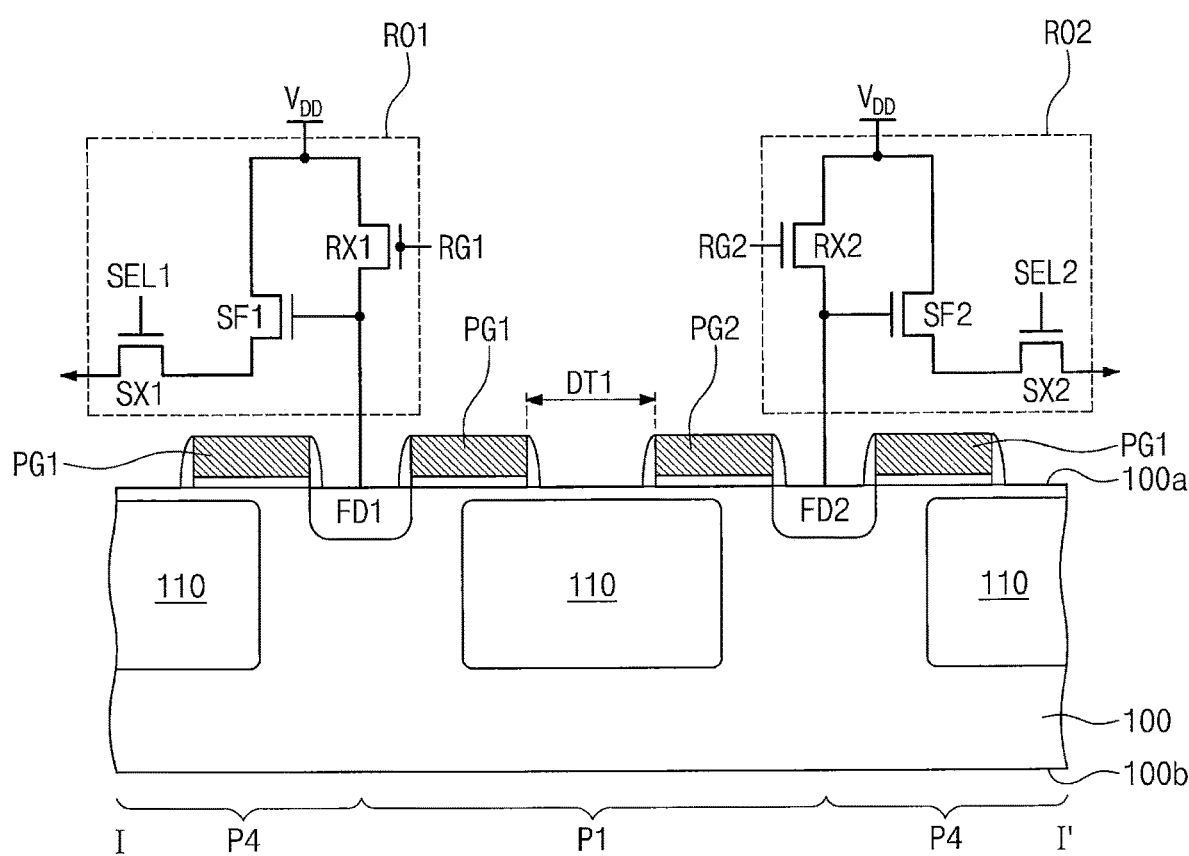
FIG. 3D is a sectional view taken along a line I-I' of FIG. 3C to illustrate a pixel array of an image sensor according to some embodiments of the inventive concept.

FIG. 3B is a plan view illustrating a unit pixel of an image sensor according to some embodiments of the inventive concept. FIG. 3C is a plan view illustrating a pixel array of an image sensor according to some embodiments of the inventive concept. FIG. 3D is a sectional view taken along a line I-I' of FIG. 3C to illustrate a pixel array of an image sensor according to some embodiments of the inventive concept.

Referring to FIGS. 3A, 3B, 3C, and 3D, the unit pixel P may include the first and second floating diffusion regions FD1 and FD2 (i.e., first and second charge detection nodes), the first and second photo gate electrodes PG1 and PG2 therebetween, and the first and second readout circuits RO1 and RO2.

In detail, a semiconductor substrate 100 may have a first or front surface 100a and a second or rear surface 100b that is opposite the first or front surface 100a. An incident light may be incident into the semiconductor substrate 100 through the second surface 100b.

The semiconductor substrate 100 may be a bulk silicon wafer of a first conductivity type (e.g., p-type), on which an epitaxial layer of the first conductivity type is provided. In some embodiments, the bulk silicon substrate may be removed during a process of fabricating the image sensor, and in this case, the p-type epitaxial layer may be used as the semiconductor substrate 100. In some embodiments, the semiconductor substrate 100 may be a bulk semiconductor substrate, in which a well region of the first conductivity type is provided.

In the unit pixel P, a photoelectric conversion region 110 may be provided in the semiconductor substrate 100. The photoelectric conversion region 110 may be configured to generate photocharges in proportional to an amount of externally incident light and to store the photocharges. The photoelectric conversion region 110 may be located at a center region of each of the unit pixels (e.g., a first pixel P1, a second pixel P2, a third pixel P3, or a fourth pixel P4), when viewed in a plan view. In some embodiments, the photoelectric conversion regions 110 may be formed by injecting impurities into the semiconductor substrate 100 of the first conductivity type and may have a second conductivity type different from the first conductivity type of the semiconductor substrate 100. The semiconductor substrate 100 and the photoelectric conversion region 110 may have different conductivity types from each other and may form a photo diode or a pn junction. In some embodiments, the photoelectric conversion region 110 may be a portion of the semiconductor substrate 100 located between the first and second photo gate electrodes PG1 and PG2.

In each of the unit pixels P (e.g., a first pixel P1, a second pixel P2, a third pixel P3, or a fourth pixel P4), the first and second photo gate electrodes PG1 and PG2 may be disposed on the semiconductor substrate 100. A gate insulating layer may be provided between the first and second photo gate electrodes PG1 and PG2 and the semiconductor substrate 100. The first and second photo gate electrodes PG1 and PG2 may be formed of or include doped polysilicon or a metal material (e.g., tungsten and aluminum). The gate insulating layer may be formed of or include at least one of, for example, silicon oxide, silicon nitride, or silicon oxynitride.

The first and second photo gate electrodes PG1 and PG2 may be spaced apart from each other, on the photoelectric conversion region 110. The first photo gate electrode PG1 and the second photo gate electrode PG2 may have substantially the same size. Each of the first and second photo gate electrodes PG1 and PG2 may overlap a portion of the photoelectric conversion region 110, when viewed in a plan view, as illustrated in FIG. 3D. In some embodiments, the first photo gate electrode PG1 and the second photo gate electrode PG2 have substantially the same width in a third direction D3, as illustrated in FIG. 3D.

In some embodiments, the first and second photo gate electrodes PG1 and PG2 in a single unit pixel may be spaced apart from each other in the third direction D3 or a fourth direction D4, as illustrated in FIG. 3C. Each of the third direction D3 and the fourth direction D4 may be diagonal to both first and second directions D1 and D2, and the first and second directions D1 and D2 may be perpendicular to each other. The fourth direction D4 and the third direction D3 may be mirror-symmetric to each other, and the fourth direction D4 may traverse or cross the third direction D3. In some embodiments, the fourth direction D4 and the third direction D3 may be perpendicular to each other, as illustrated in FIG. 3C. It will be understood that a direction X diagonal to a direction Y refers to the direction X slanted with respect to the direction Y and may refer to the direction X forming an angle of 45 degrees with the direction Y.

In each unit pixel P1-P4, the first and second photo gate electrodes PG1 and PG2 may have a polygonal shape, and a distance between facing side surfaces thereof may be uniform. The first and second photo gate electrodes PG1 and PG2 may be disposed to have the mirror symmetry with respect to an imaginary line parallel to the third or fourth direction D3 or D4. In some embodiments, the first and second photo gate electrodes PG1 and PG2 in a single unit pixel may be spaced apart from each other by a first distance DT1, as illustrated in FIGS. 3B, 3C and 3D. In some embodiments, as illustrated in FIG. 3B, the first and second photo gate electrodes PG1 and PG2 may be mirror-symmetric with respect to an imaginary line extending in the fourth direction D4.

The first floating diffusion region FD1 may be provided in a portion of the semiconductor substrate 100 located adjacent to (e.g., at) one side of the first photo gate electrode PG1, and the second floating diffusion region FD2 may be provided in another portion of the semiconductor substrate 100 located adjacent to (e.g., at) an opposite side of the second photo gate electrode PG2, as illustrated in FIG. 3D. When viewed in a plan view, the first and second photo gate electrodes PG1 and PG2 may be disposed between the first and second floating diffusion regions FD1 and FD2.

The first and second floating diffusion regions FD1 and FD2 may be formed by doping the semiconductor substrate 100 with n-type impurities. In the first and second floating diffusion regions FD1 and FD2, an n-type impurity concentration may be higher than that of the photoelectric conversion layer (e.g., the photoelectric conversion regions 110).

The first floating diffusion region FD1 may store photoelectric charges, which are transferred from the photoelectric conversion region 110 through the first photo gate electrode PG1. The second floating diffusion region FD2 may store photoelectric charges, which are transferred from the photoelectric conversion region 110 through the second photo gate electrode PG2.

In each unit pixels P1-P4, the first and second floating diffusion regions FD1 and FD2 may be spaced apart from each other in the third or fourth direction D3 or D4, when viewed in a plan view. In other words, in each unit pixel P1-P4, the first and second floating diffusion regions FD1 and FD2 and the first and second photo gate electrodes PG1 and PG2 may be arranged in the third or fourth direction D3 or D4.

Each of the first and second floating diffusion regions FD1 and FD2 may include a first portion and a second portion, which extend in the first and second directions D1 and D2, respectively, when viewed in a plan view. Each of the first and second floating diffusion regions FD1 and FD2 may be disposed between the first and second photo gate electrodes PG1 and PG2 of four unit pixels P1-P4, which are adjacent to each other.

In each of the unit pixels P1-P4, the semiconductor substrate 100 may include the photoelectric conversion region 110, to which light is incident, and first and second readout circuit regions, in which the first and second readout circuits RO1 and RO2 are provided. The photoelectric conversion region 110 and the first and second readout circuit regions may be defined by a device isolation layer (not shown) formed in the semiconductor substrate 100.

The first reset transistor RX1, the first amplification transistor SF1, and the first selection transistor SX1 described with reference to FIG. 3A may be provided on the first readout circuit region. For example, a first reset gate electrode RG1, a first amplification gate electrode AG1, and a first selection gate electrode SEL1 may be disposed on the first readout circuit region of the semiconductor substrate 100, and source/drain impurity regions may be formed in portions of the semiconductor substrate 100 located at both sides of each of the first reset, first amplification, and first selection gate electrodes RG1, AG1, and SEL1. The first reset, first amplification, and first selection gate electrodes RG1, AG1, and SEL1 may be spaced apart from each other in the second direction D2.

The second reset transistor RX2, the second amplification transistor SF2, and the second selection transistor SX2 described with reference to FIG. 3A may be provided on the second readout circuit region. For example, a second reset gate electrode RG2, a second amplification gate electrode AG2, and a second selection gate electrode SEL2 may be disposed on the second readout circuit region of the semiconductor substrate 100, and source/drain impurity regions may be formed in portions of the semiconductor substrate 100 located at both sides of each of the second reset, second amplification, and second selection gate electrodes RG2, AG2, and SEL2. The second reset, second amplification, and second selection gate electrodes RG2, AG2, and SEL2 may be spaced apart from each other in the second direction D2.

In some embodiments, the first and second floating diffusion regions FD1 and FD2 may be spaced apart from each other in the third direction D3, and the first and second readout circuits RO1 and RO2 may be spaced apart from each other in the fourth direction D4 different from the third direction D3. In some embodiments, the first and second floating diffusion regions FD1 and FD2 may be spaced apart from each other in the fourth direction D4, and the first and second readout circuits RO1 and RO2 may be spaced apart from each other in the third direction D3.

Referring to FIGS. 3C and 3D, a pixel array 10 of the image sensor may include a plurality of unit pixels P1, P2, P3, and P4, which are arranged in the first direction D1 and the second direction D2 perpendicular to each other. Each of the unit pixels P1-P4 may be configured to have the same features as the unit pixel P described with reference to FIGS. 3A and 3B.

In some embodiments, a group of the unit pixels including the first through fourth unit pixels P1-P4 may include first and second unit pixels P1 and P2, which are directly adjacent to each other in the first direction D1, a third unit pixel P3, which is directly adjacent to the first unit pixel P1 in the second direction D2, and a fourth unit pixel P4, which is directly adjacent to the second unit pixel P2 in the second direction D2.

It will be understood that the term "directly adjacent to" as used herein includes configurations where two "elements," which are said to be directly adjacent to one another, are positioned so that no other like element is located between these two elements. For example, as shown in FIG. 3C, the first and second unit pixels P1 and P2 are directly adjacent to one another in that no other unit pixel is between the first and second unit pixels P1 and P2.

Each of the first and second readout circuits RO1 and RO2 may be enclosed by the first and second photo gate electrodes PG1 and PG2 of four unit pixels P1-P4, when viewed in a plan view.

In the pixel array 10, the first or second floating diffusion region FD1 or FD2 and the first or second readout circuit RO1 or RO2 may be alternately disposed and spaced apart from each other in the first direction D1 and the second direction D2. The first and second photo gate electrodes PG1 and PG2 and the first and second floating diffusion regions FD1 and FD2 may be arranged in the third direction D3 and the fourth direction D4.

The first and second unit pixels P1 and P2 adjacent to each other in the first direction D1 may be mirror-symmetric with respect to an imaginary line extending in the second direction D2. The first and third unit pixels P1 and P3 adjacent to each other in the second direction D2 may be mirror-symmetric with respect to an imaginary line extending in an imaginary line extending in the first direction D1.

In some embodiments, the first and second unit pixels P1 and P2 that are directly adjacent to each other in the first direction D1 may be mirror-symmetric with respect to an imaginary line that passes through the center FD1_C of the first floating diffusion region FD1 or the center FD2_C of the second floating diffusion region FD2 and extends in the second direction D2, as illustrated in FIG. 3C. It will be understood that the imaginary line that passes through the center FD1_C of the first floating diffusion region FD1 or the center FD2_C of the second floating diffusion region FD2 and extends in the second direction D2 may be the same as a boundary of the first and second unit pixels P1 and P2 that are directly adjacent to each other in the first direction D1.

In some embodiments, the first and third unit pixels P1 and P3 directly adjacent to each other in the second direction D2 may be mirror-symmetric with respect to an imaginary line that passes through the center FD1_C of the first floating diffusion region FD1 or the center FD2_C of the second floating diffusion region FD2 and extends in the first direction D1, as illustrated in FIG. 3C. It will be understood that the imaginary line that passes through the center FD1_C of the first floating diffusion region FD1 or the center FD2_C of the second floating diffusion region FD2 and extends in the first direction D1 may be the same as a boundary of the first and third unit pixels P1 and P3 directly adjacent to each other in the second direction D2.

The fourth unit pixel P4 may be provided between the third unit pixels P3 in the first direction D1 and may be provided between the second unit pixels P2 in the second direction D2. Here, the fourth unit pixel P4 may be mirror-symmetric to the second unit pixel P2 with respect to the first floating diffusion region FD1 and may be mirror-symmetric to the third unit pixel P3 with respect to the second floating diffusion region FD2.

As an example, the first or second floating diffusion region FD1 or FD2 may be provided between four unit pixels P1-P4 adjacent to each other, as illustrated in FIG. 3C. The first or second readout circuit RO1 or RO2 may be provided between four adjacent unit pixels P1-P4, as illustrated in FIG. 3C. In this arrangement, a group of four adjacent unit pixels P1-P4 may share the first or second floating diffusion region FD1 or FD2, and a group of four adjacent unit pixels P1-P4 may share the first or second readout circuit RO1 or RO2.

In some embodiments, a single first floating diffusion region FD1 may be shared by four adjacent unit pixels (i.e., a first unit pixel P1, a second unit pixel P2, a third unit pixel P3, and a fourth unit pixel P4), as illustrated in FIG. 3C, and thus may be referred to as a shared first floating diffusion region. Referring to FIG. 3C, a first portion of the first floating diffusion region FD1 may be a first floating diffusion region of the first unit pixel P1, a second portion of the first floating diffusion region FD1 may be a first floating diffusion region of the second unit pixel P2, a third portion of the first floating diffusion region FD1 may be a first floating diffusion region of the third unit pixel P3, and a fourth portion of the first floating diffusion region FD1 may be a first floating diffusion region of the fourth unit pixel P4.

In some embodiments, a single second floating diffusion region FD2 may be shared by four adjacent unit pixels (i.e., a first unit pixel P1, a second unit pixel P2, a third unit pixel P3, and a fourth unit pixel P4), as illustrated in FIG. 3C, and thus may be referred to as a shared second floating diffusion region. Referring to FIG. 3C, a first portion of the second floating diffusion region FD2 may be a second floating diffusion region of the first unit pixel P1, a second portion of the second floating diffusion region FD2 may be a second floating diffusion region of the second unit pixel P2, a third portion of the second floating diffusion region FD2 may be a second floating diffusion region of the third unit pixel P3, and a fourth portion of the second floating diffusion region FD2 may be a second floating diffusion region of the fourth unit pixel P4.

Figure 4:
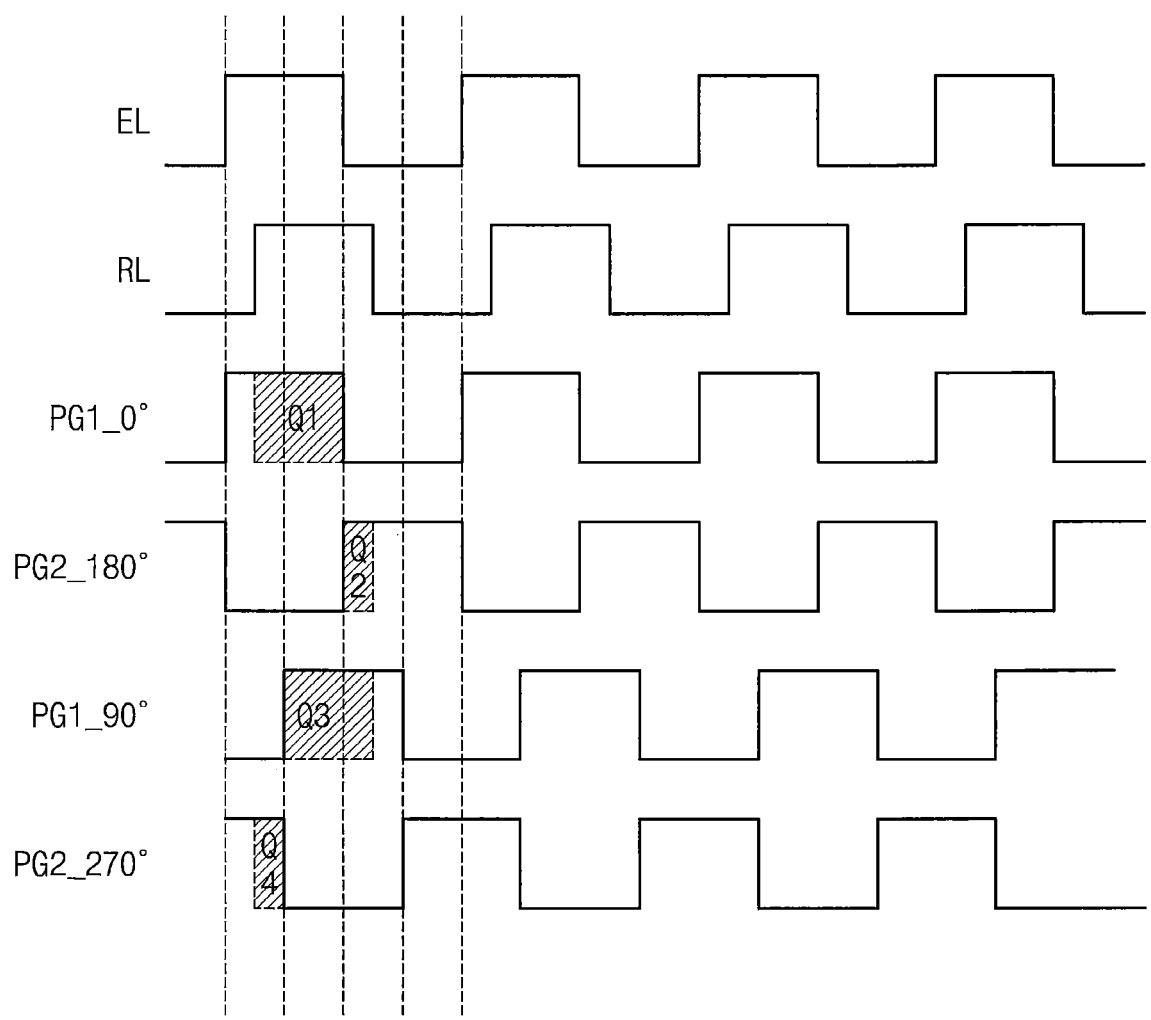
FIG. 4 is a timing diagram illustrating operations of a unit pixel of an image sensor according to some embodiments of the inventive concept.

FIG. 4 is a timing diagram illustrating operations of a unit pixel of an image sensor according to some embodiments of the inventive concept.

Referring to FIGS. 3A, 3B, 3C, and 4, an pulsed optical signal EL may be output from the light source 1 (e.g., see FIG. 1) toward an object. Although FIG. 4 illustrates the optical signal EL having rectangular pulses, it will be understood that a sinusoidal wave signal may be used as the optical signal EL. The light RL reflected from the object (e.g., a target object) may be incident into the unit pixels P1-P4 with a retarded time (e.g., a delay), which is given by a function of a distance from the light source and the target object.

In each unit pixel P1-P4, a first photo control signal PG1_0, which is synchronized with the optical signal EL provided to the object, may be applied to the first photo gate electrode PG1, and a second photo control signal PG2_180, which has a phase difference of 180° with respect to the first photo control signal PG1_0, may be applied to the second photo gate electrode PG2. For example, the first photo control signal PG1_0 and the second photo control signal PG2_180 may be alternately activated. In other words, when a high voltage is applied to the first photo gate electrode PG1, a low voltage may be applied to the second photo gate electrode PG2.

Thereafter, a third photo control signal PG1_90, which has a phase difference of 90° with respect to the first photo control signal PG1_0, may applied to the first photo gate electrode PG1, and a fourth photo control signal PG2_270 which has a phase difference of 180° with respect to the third photo control signal PG1_90, may be applied to the second photo gate electrode PG2. The third and fourth photo gate signals PG1_90 and PG2_270 may be sequentially applied with a specific time interval with respect to the first and second photo gate signals PG1_0 and PG2_180.

An electric potential of the photoelectric conversion region 110 may be changed by the first and second photo control signals PG1_0 and PG2_180 or the third and fourth photo control signals PG1_90 and PG2_270 applied to the first and second photo gate electrodes PG1 and PG2.

Photocharges may be detected in the first and second floating diffusion regions FD1 and FD2 in response to the first and second photo control signals PG1_0 and PG2_180, and then, photocharges may be detected in the first and second floating diffusion regions FD1 and FD2 in response to the third and fourth photo control signals PG1_90 and PG2_270.

In detail, when a high voltage is applied to the first photo gate electrode PG1 by the first photo control signal PG1_0, photocharges produced in the photoelectric conversion region 110 may be transferred to the first floating diffusion region FD1. Information on an amount Q1 of photocharges stored in the first floating diffusion region FD1 may be output as a first pixel signal, through the first readout circuit RO1. In addition, when a positive voltage is applied to the second photo gate electrode PG2 by the second photo control signal PG2_180, photocharges produced in the photoelectric conversion region 110 may be transferred to the second floating diffusion region FD2. Information on an amount Q2 of photocharges stored in the second floating diffusion region FD2 may be output as a second pixel signal through the second readout circuit RO2.

The charge amounts Q1 and Q2 detected by the first and second floating diffusion regions FD1 and FD2 may be changed depending on an overlapping time between the reflected optical signal RL and the first and second photo control signals PG1_0 and PG2_180.

In detail, a delay time of the reflected light RL may be determined from a difference between the photo-charge amount Q1, which is measured through the first floating diffusion regions FD1 during the overlapping time between the reflected optical signal RL and the first photo control signal PG1_0, and the photo-charge amount Q2, which is measured through the second floating diffusion regions FD2 during the overlapping time between the reflected optical signal RL and the second photo control signal PG2_180. Next, a delay time of the reflected light RL may be determined from a difference between a photo-charge amount Q3, which is measured through the first floating diffusion regions FD1 during the overlapping time between the reflected optical signal RL and the third photo control signal PG1_90, and a photo-charge amount Q4, which is measured through the second floating diffusion regions FD2 during the overlapping time between the reflected optical signal RL and the fourth photo control signal PG2_270. This means that a difference between signals output from the first and second floating diffusion regions FD1 and FD2 may be measured two times, and the measured signal difference may be used to determine a distance (i.e., an optical depth) between the light source and the target object.

In some embodiments, the first photo control signal PG1_0 may be applied in common to the first photo gate electrodes PG1 of four adjacent unit pixels (e.g., the first to fourth unit pixels P1-P4). In this case, photoelectric charges, which are produced in the photoelectric conversion regions 110 of the four adjacent unit pixels (e.g., the first to fourth unit pixels P1-P4), may be transferred to one of the first floating diffusion regions FD1. Similarly, the second photo control signal PG1_180 may be applied in common to the second photo gate electrodes PG2 of the four adjacent unit pixels (e.g., the first to fourth unit pixels P1-P4). In this case, photoelectric charges, which are produced in the photoelectric conversion regions 110 of the four adjacent unit pixels (e.g., the first to fourth unit pixels P1-P4), may be transferred to one of the second floating diffusion regions FD2. Thus, an amount of charges, which can be detected by one of the second floating diffusion regions FD2, may be increased, and this may make it possible to improve sensitivity of the image sensor.

FIGS. 5A, 6A, 7A, and 8A are circuit diagrams, each of which illustrates a unit pixel of an image sensor according to some embodiments of the inventive concept. FIGS. 5B, 6B, 7B, and 8B are plan views, each of which illustrates a unit pixel of an image sensor according to some embodiments of the inventive concept. FIGS. 5C, 6C, 7C, and 8C are plan views, each of which illustrates a pixel array of an image sensor according to some embodiments of the inventive concept. FIGS. 5D, 6D, 7D, and 8D are sectional views, each of which illustrates a pixel array of an image sensor according to some embodiments of the inventive concept, and which are taken along lines I-I' of FIGS. 5C, 6C, 7C, and 8C.

For concise description, previously described elements may be identified by a similar or identical reference number without repeating descriptions thereof.

Figure 5A:
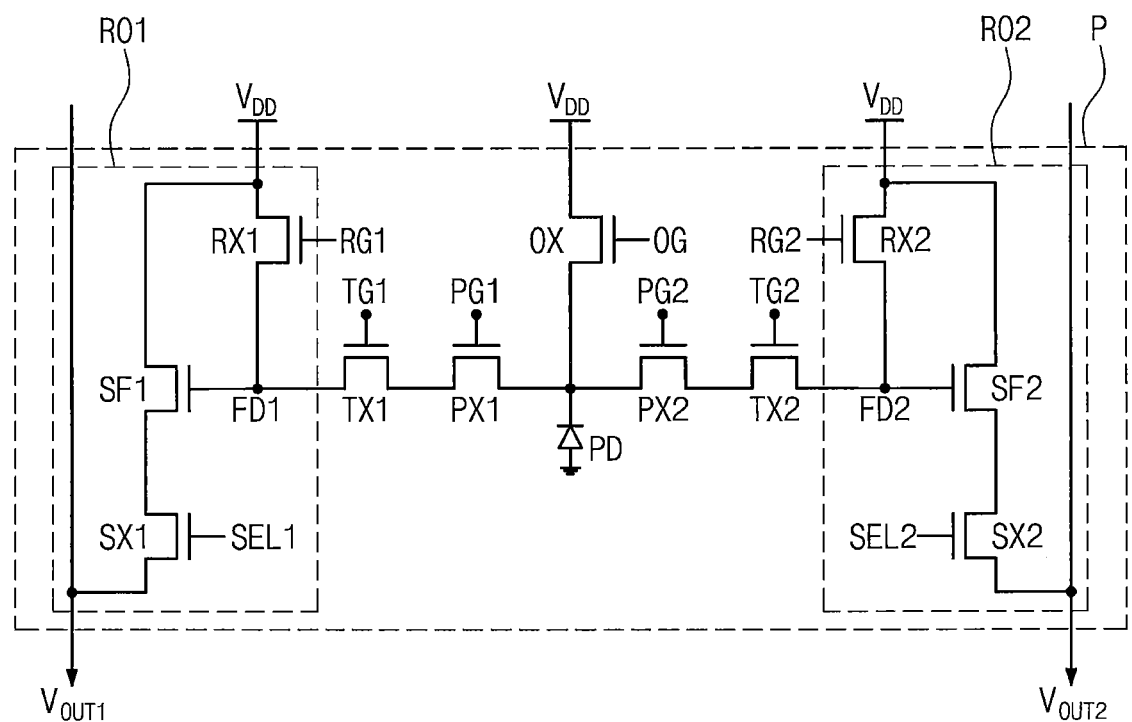
FIGS. 5A, 6A, 7A, and 8A are circuit diagrams, each of which illustrates a unit pixel of an image sensor according to some embodiments of the inventive concept.

Referring to FIG. 5A, the unit pixel P may include the photoelectric conversion device PD, the first and second photo transistors PX1 and PX2, the first readout circuit RO1 connected to the first photo transistor PX1, and the second readout circuit RO2 connected to the second photo transistor PX2, as described above. Here, the first readout circuit RO1 may include a first transfer transistor TX1, the first reset transistor RX1, the first amplification transistor SF1, and the first selection transistor SX1. The second readout circuit RO2 may include a second transfer transistor TX2, the second reset transistor RX2, the second amplification transistor SF2, and the second selection transistor SX2.

The first transfer transistor TX1 may be provided between and connected to the drain of the first photo transistor PX1 and the gate of the first amplification transistor SF1. The second transfer transistor TX2 may be provided between and connected to the drain of the second photo transistor PX2 and the gate of the second amplification transistor SF2. The first transfer transistor TX1 may be controlled by a first transfer signal applied to a first transfer gate electrode TG1, and the second transfer transistor TX2 may be controlled by a second transfer signal applied to a second transfer gate electrode TG2.

When the first photo transistor PX1 is turned-on, photocharges may be produced in the photoelectric conversion device PD, and when the first transfer transistor TX1 is turned-on, the photocharges produced in the photoelectric conversion device PD may be stored in the first charge detection node FD1. When the second photo transistor PX2 is turned-on, photocharges may be produced in the photoelectric conversion device PD, and when the second transfer transistor TX2 is turned-on, the photocharges produced in the photoelectric conversion device PD may be stored in the second charge detection node FD2.

Furthermore, the unit pixel P may include an overflow transistor OX, which is provided between and connected to the power voltage VDD and the photoelectric conversion device PD. The overflow transistor OX may be controlled by an overflow control signal. The overflow transistor OX may be turned-off, when the first and second transfer transistors TX1 and TX2 are turned-on. The overflow transistor OX may discharge photocharges produced in the photoelectric conversion device PD, when the first and second transfer transistors TX1 and TX2 are in a turn-off state. The overflow transistor OX may possibly prevent electric charges, which are produced in the photoelectric conversion region 110, from being overflown to the first and second charge detection nodes FD1 and FD2, during the detection of the photocharges by the first and second charge detection nodes FD1 and FD2.

Figure 5B:
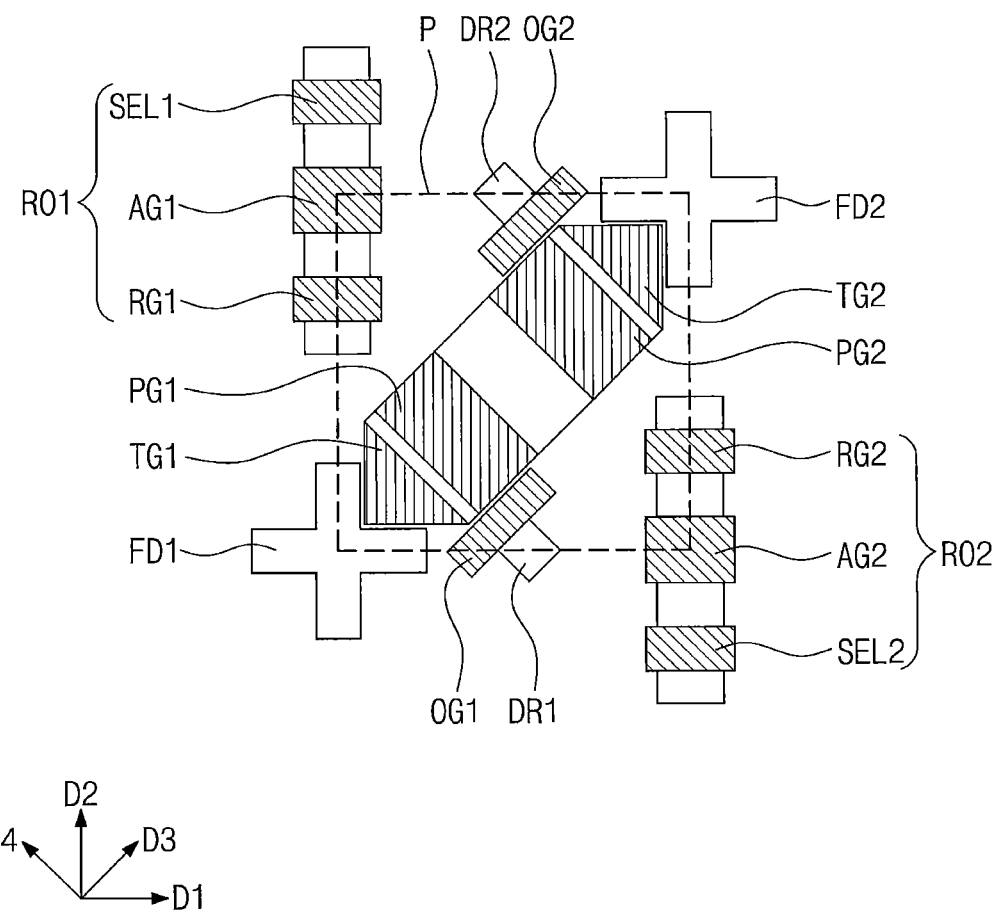
FIGS. 5B, 6B, 7B, and 8B are plan views, each of which illustrates a unit pixel of an image sensor according to some embodiments of the inventive concept.

Referring to FIG. 5B, the unit pixel P may include the first and second floating diffusion regions FD1 and FD2, the first and second photo gate electrodes PG1 and PG2 therebetween, and the first and second readout circuits RO1 and RO2, as described above.

In the unit pixel P, the first and second floating diffusion regions FD1 and FD2 may be spaced apart from each other in the third direction D3 that may be diagonal to the first and second directions D1 and D2 that may be perpendicular to each other. The first and second photo gate electrodes PG1 and PG2 may be disposed between the first and second floating diffusion regions FD1 and FD2 in the third direction D3. The first and second photo gate electrodes PG1 and PG2 have a minimum width in the third direction D3. In some embodiments, each of the first and second photo gate electrodes PG1 and PG2 may have a first width in the third direction D3, each of the first and second photo gate electrodes PG1 and PG2 may have a second width in the fourth direction D4, and the first width may be narrower than the second width, as shown in FIG. 5B. The fourth direction D4 may be perpendicular to the third direction D3.

A first transfer gate electrode TG1 may be disposed between the first floating diffusion region FD1 and the first photo gate electrode PG1, and a second transfer gate electrode TG2 may be disposed between the second floating diffusion region FD2 and the second photo gate electrode PG2. In the unit pixel P, the first and second transfer gate electrodes TG1 and TG2 may be mirror-symmetric to each other with respect to an imaginary line extending in the fourth direction D4.

Furthermore, a first overflow gate electrode OG1 may be disposed at a side of the first photo gate electrode PG1, and a first drain region DR1 may be disposed near the first overflow gate electrode OG1. A second overflow gate electrode OG2 may be disposed at a side of the second photo gate electrode PG2, and a second drain region DR2 may be disposed near the second overflow gate electrode OG2. The first and second overflow gate electrodes OG1 and OG2 may be controlled by a common control signal. The first and second drain regions DR1 and DR2 may be impurity regions that are formed by doping two portions of the semiconductor substrate 100 with n-type impurities.

Figure 5C:
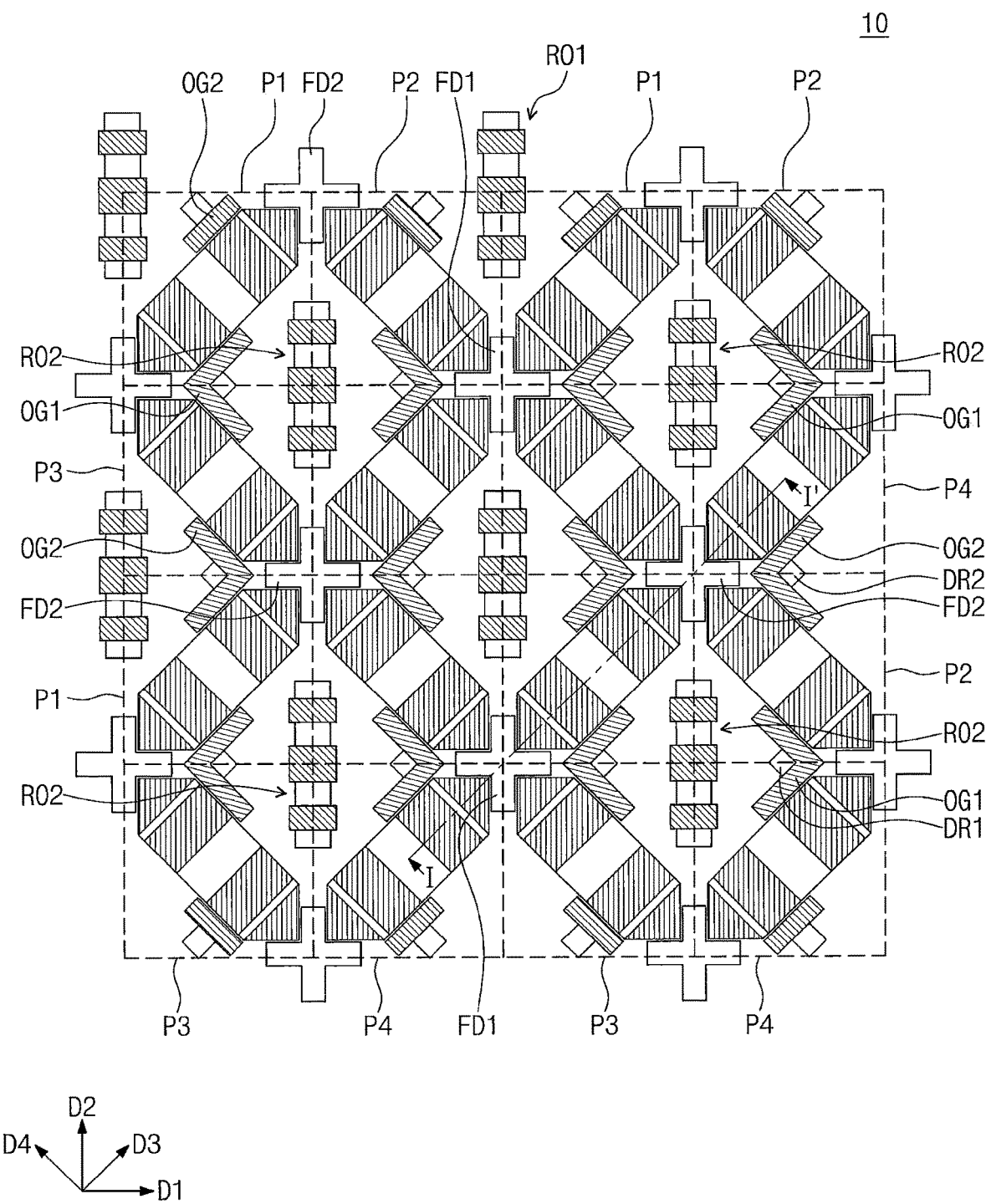
FIGS. 5C, 6C, 7C, and 8C are plan views, each of which illustrates a pixel array of an image sensor according to some embodiments of the inventive concept.
Figure 5D:
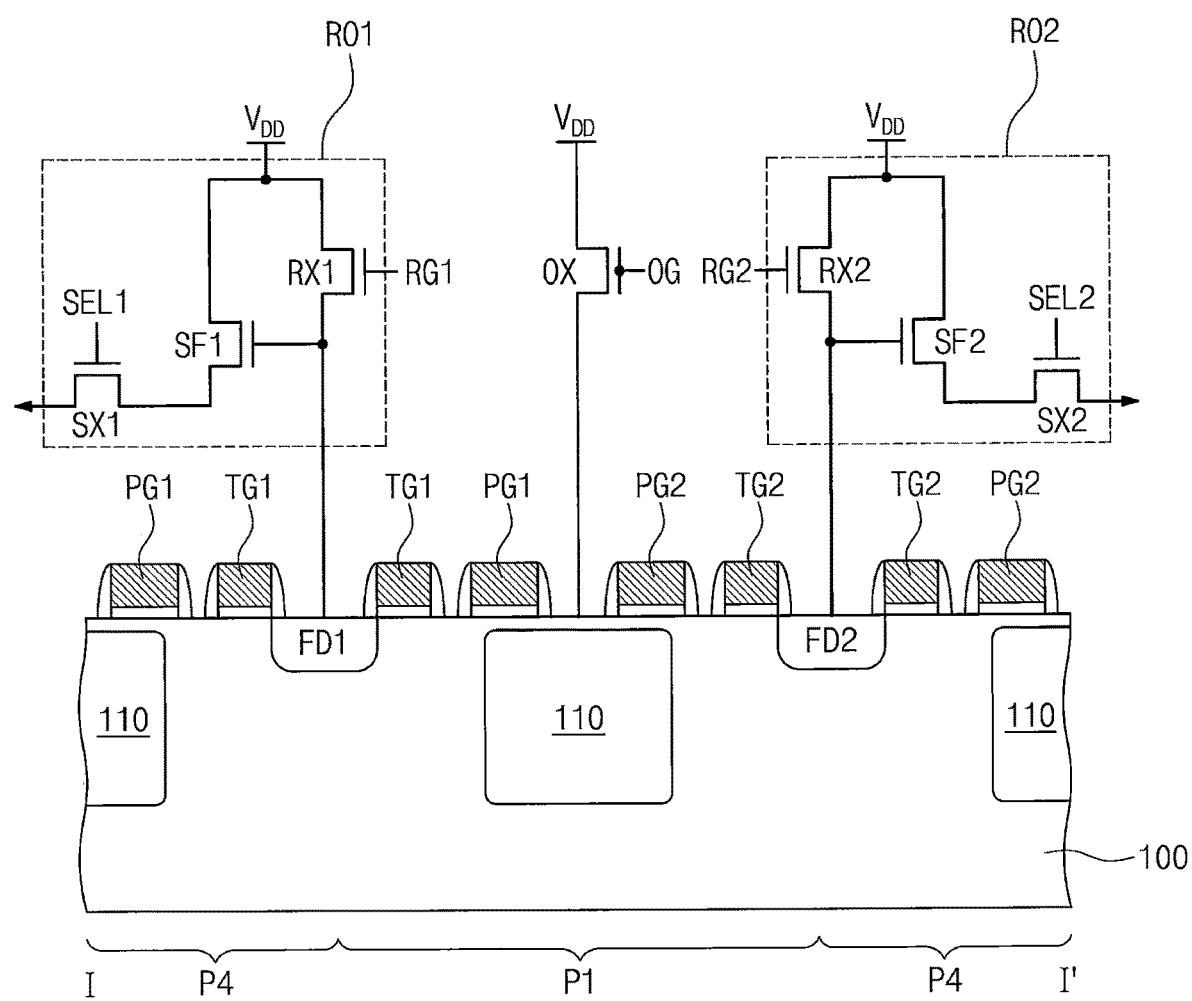
FIGS. 5D, 6D, 7D, and 8D are sectional views, each of which illustrates a pixel array of an image sensor according to some embodiments of the inventive concept, and which are taken along lines I-I' of FIGS. 5C, 6C, 7C, and 8C.

Referring to FIGS. 5C and 5D, the pixel array 10 of the image sensor may include a plurality of the unit pixels P1, P2, P3, and P4, which are arranged in the first direction D1 and the second direction D2, and the first direction D1 and the second direction D2 may be perpendicular to each other. Here, each of the unit pixels Pl-P4 may be configured to have the same features as the unit pixel P described with reference to FIGS. 5A and 5B.

The pixel array 10 may include the first to fourth unit pixels P1-P4, which are mirror-symmetric in the first direction D1 and the second direction D2, as described above.

Each of the first and second floating diffusion regions FD1 and FD2 may be disposed between the first or second transfer gate electrodes TG1 or TG2 of the first to fourth unit pixels P1-P4 adjacent to each other.

The first overflow gate electrode OG1 may be disposed between the first transfer gate electrodes TG1 of the first and third unit pixels P1 and P3, which are adjacent to each other in the second direction D2. The second overflow gate electrode OG2 may be disposed between the second transfer gate electrodes TG2 of the second and fourth unit pixels P2 and P4, which are adjacent to each other in the second direction D2.

The first and second overflow gate electrodes OG1 and OG2 may have a mirror-symmetric shape with respect to an imaginary line parallel to the first direction D1 or the second direction D2.

Figure 6A:
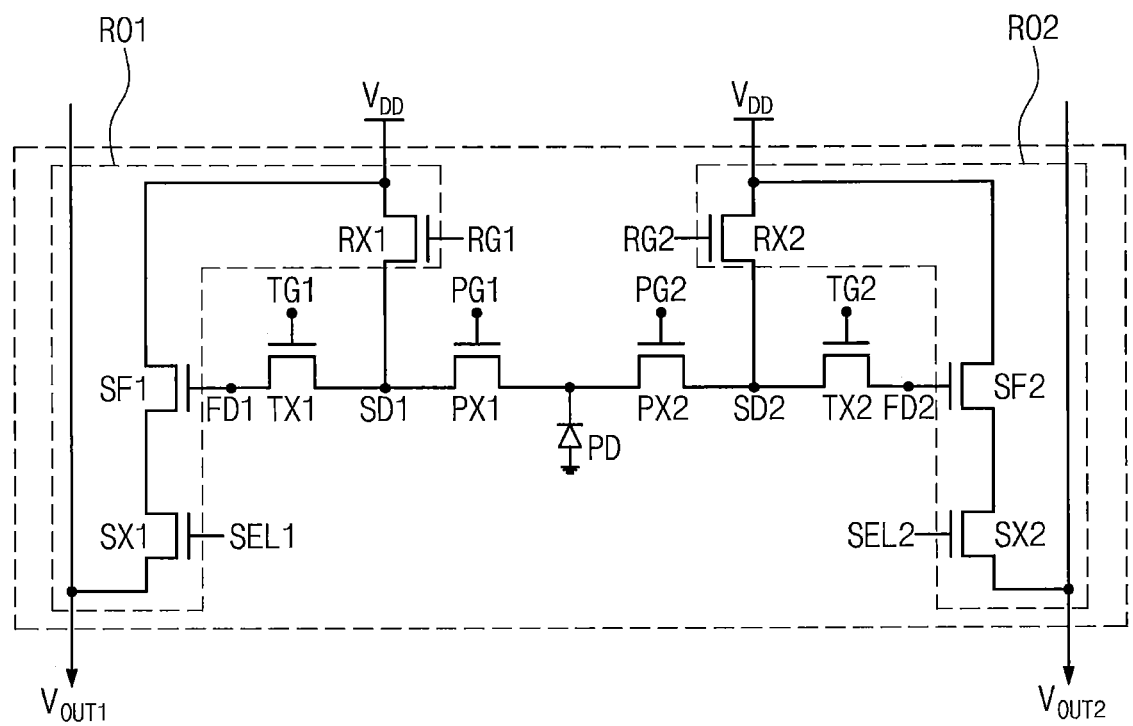
Figure 6B:
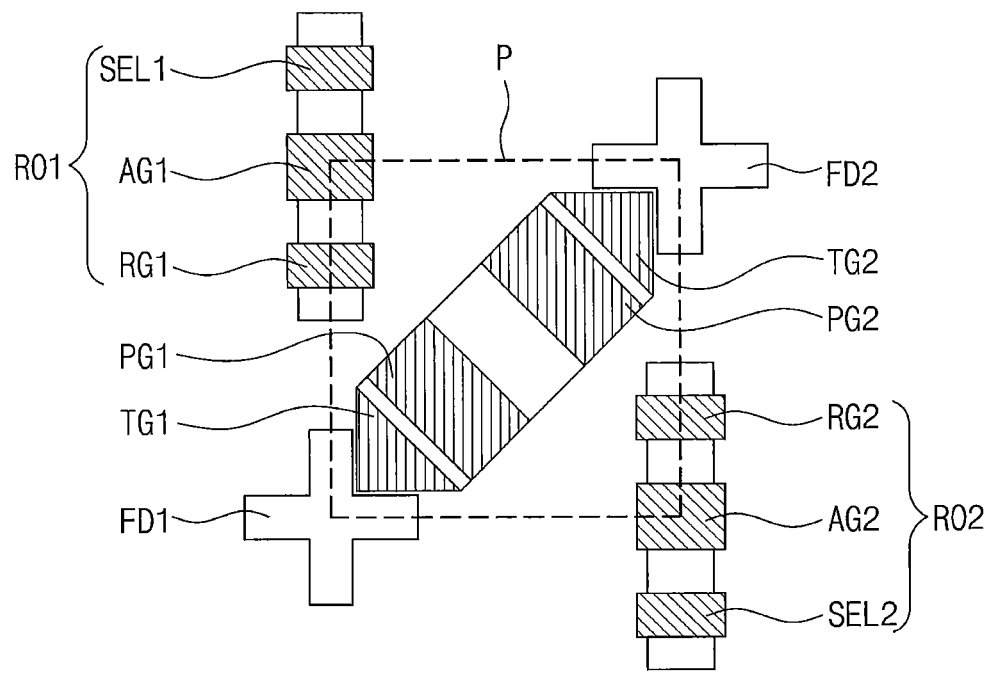
Figure 6B:
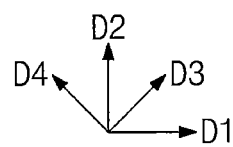
Figure 6C:
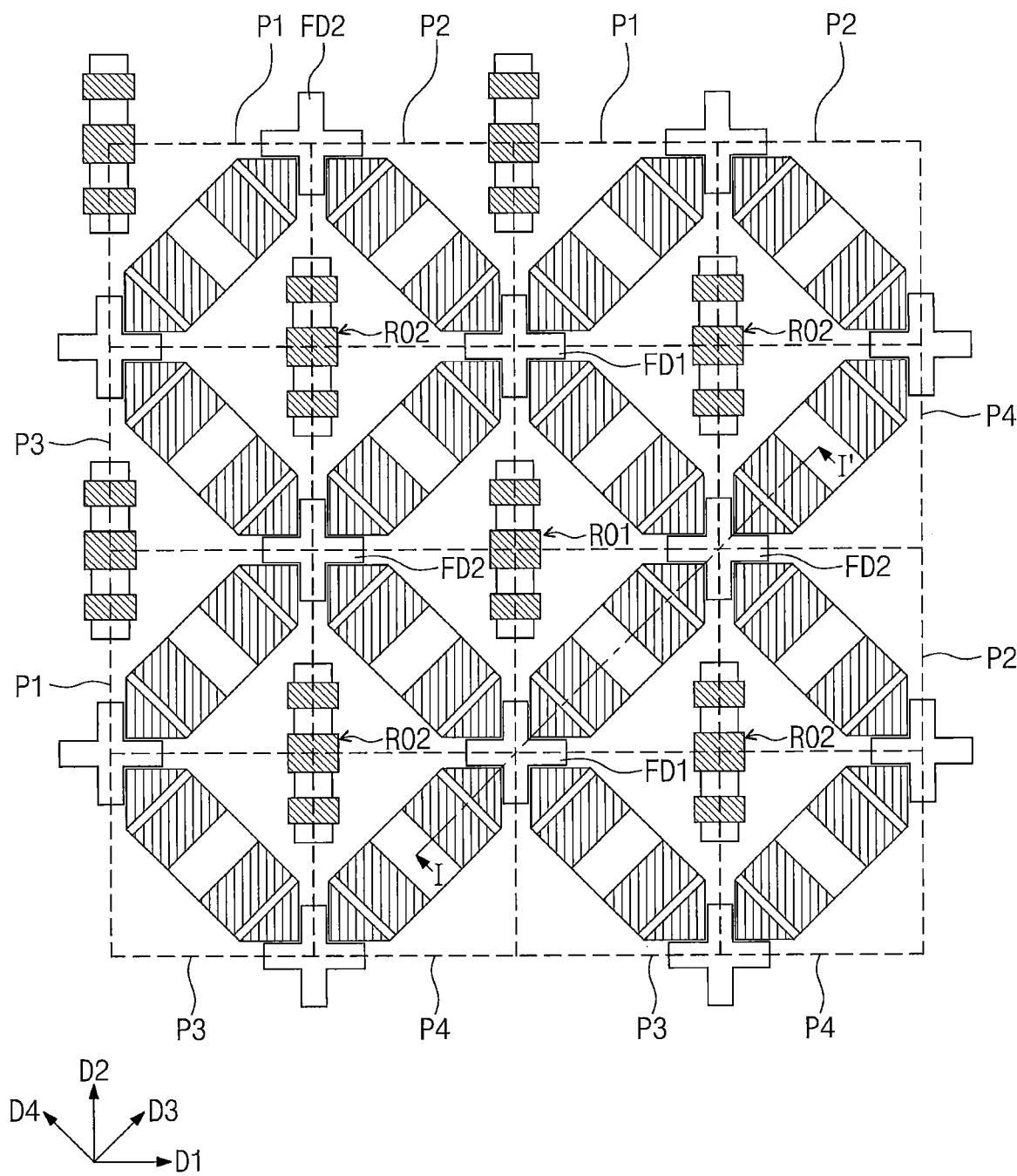
Figure 6D:
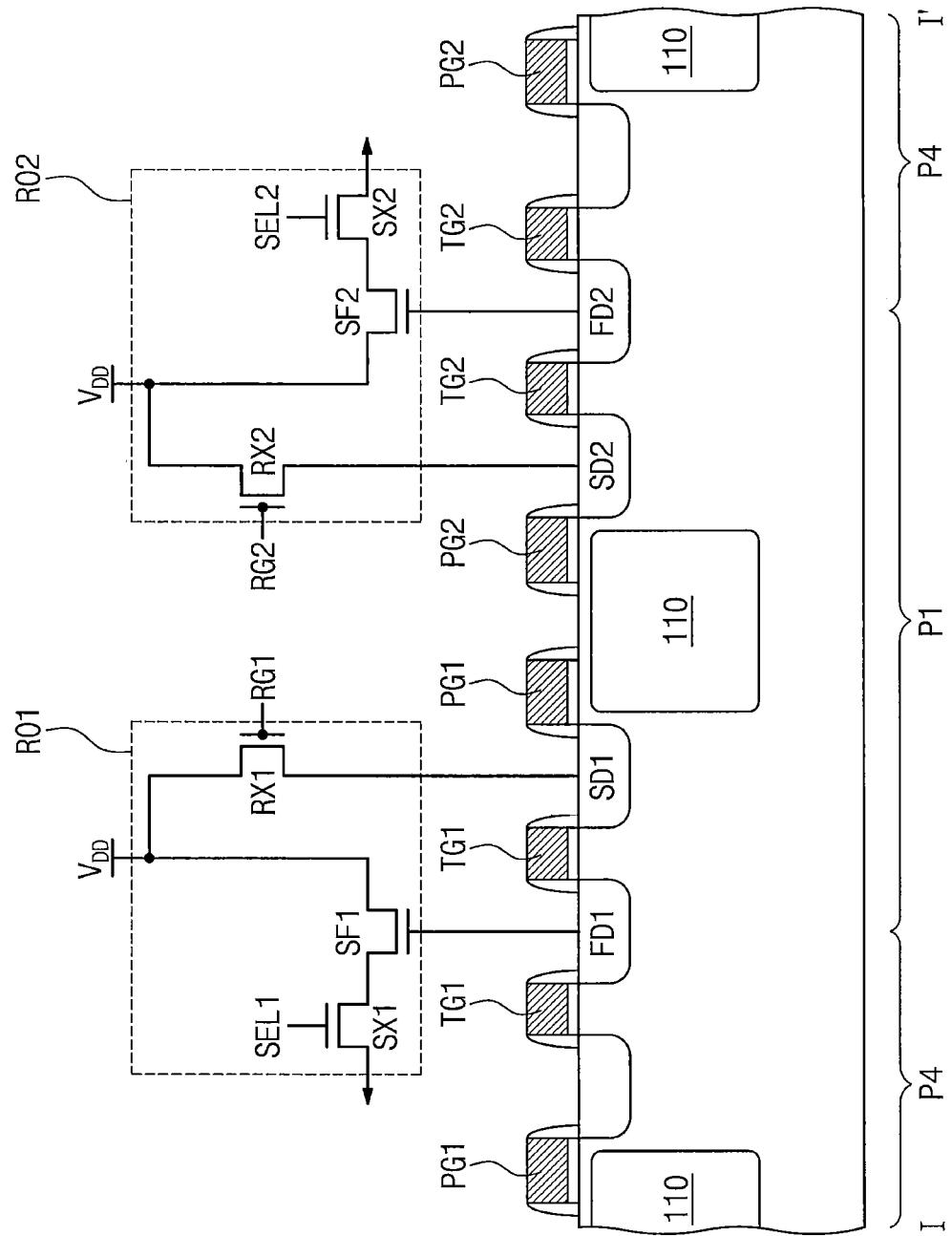

In some embodiments of FIG. 6A, the overflow transistor OX, which is provided in the unit pixel P of FIG. 5A, may be omitted, and in the first readout circuit RO1, the first reset transistor RX1 may be connected to a node between the first photo transistor PX1 and the first transfer transistor TX1. Similarly, in the second readout circuit RO2, the second reset transistor RX2 may be connected to a node between the second photo transistor PX2 and the second transfer transistor TX2. Referring to FIG. 6B, the first and second overflow gate electrodes OG1 and OG2, which are provided in the unit pixel P of FIG. 5B, may be omitted.

Referring to FIGS. 6A and 6B, electric charges produced in the photoelectric conversion region 110 may be stored at a first or second storage diode region SD1 or SD2. The photocharges stored in the first or second storage diode region SD1 or SD2 may be transferred to the first and second floating diffusion regions FD1 and FD2, which are connected to the first and second amplification transistors SF1 and SF2, through the first and second transfer transistors TX1 and TX2 or may be discharged through the first or second reset transistor RX1 or RX2.

Figure 7A:
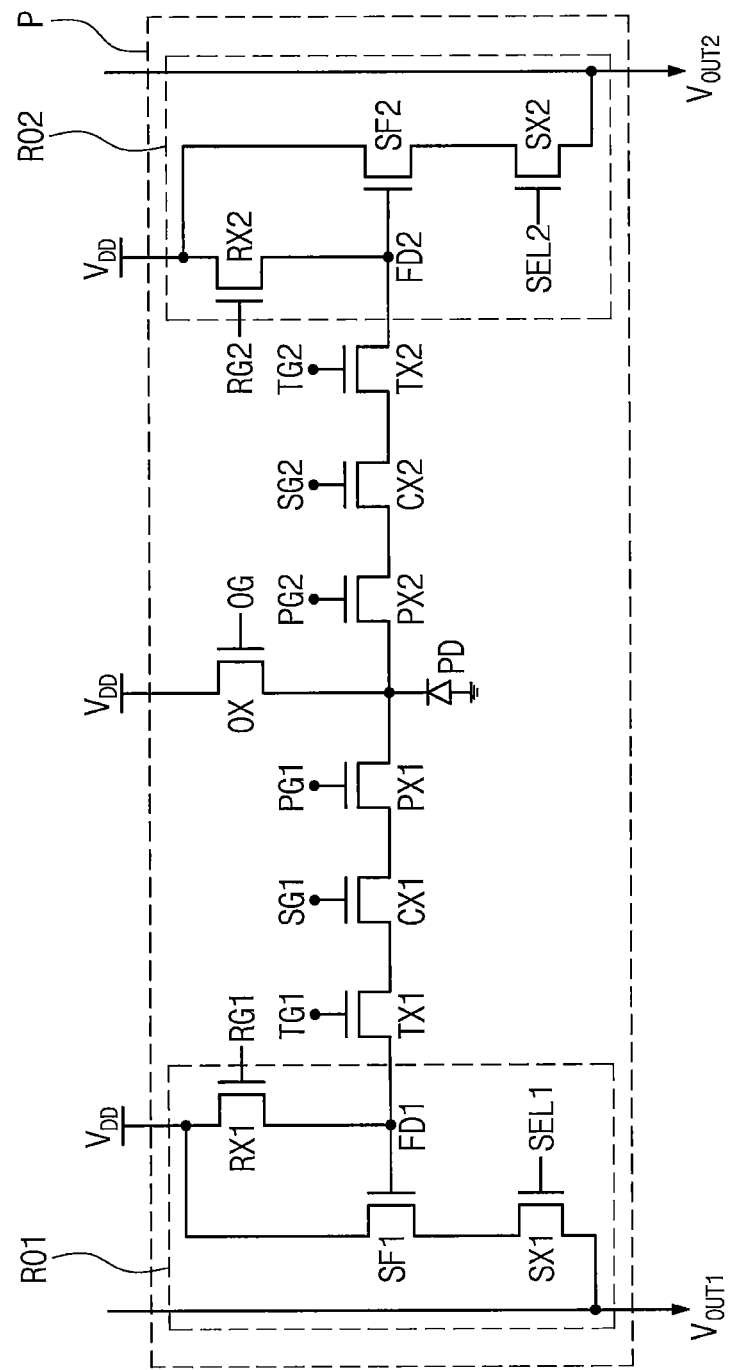

Referring to FIG. 7A, the unit pixel P may further include first and second storage transistors CX1 and CX2, compared with the unit pixel P described with reference to FIG. 5A. The first and second storage transistors CX1 and CX2 may store electric charges or may transfer the photocharges to the first and second transfer transistors TX1 and TX2, according to the first and second storage control signals applied to first and second storage gate electrodes SG1 and SG2.

In detail, the first storage transistor CX1 may be provided between and connected to the first photo transistor PX1 and the first transfer transistor TX1 and may be controlled by the first storage control signal applied to the first storage gate electrode SG1. The second storage transistor CX2 may be provided between and connected to the second photo transistor PX2 and the second transfer transistor TX2 and may be controlled by the second storage control signal applied to the second storage gate electrode SG2.

Electric charges produced by the first photo transistor PX1 may be stored in an electric field region, which is induced in the semiconductor substrate 100, by a storage control signal applied to a gate of the first storage transistor CX1. In some embodiments, although not illustrated in the drawings, a first storage diode may be connected between the first storage transistor CX1 and the first transfer transistor TX1, and a second storage diode may be connected between the second storage transistor CX2 and the second transfer transistor TX2. Each of the first and second storage diodes may have a structure (e.g., a semiconductor substrate and an impurity region having opposite conductivity types) similar to the photoelectric conversion device PD or may be provided in the form of a capacitor.

Figure 7B:
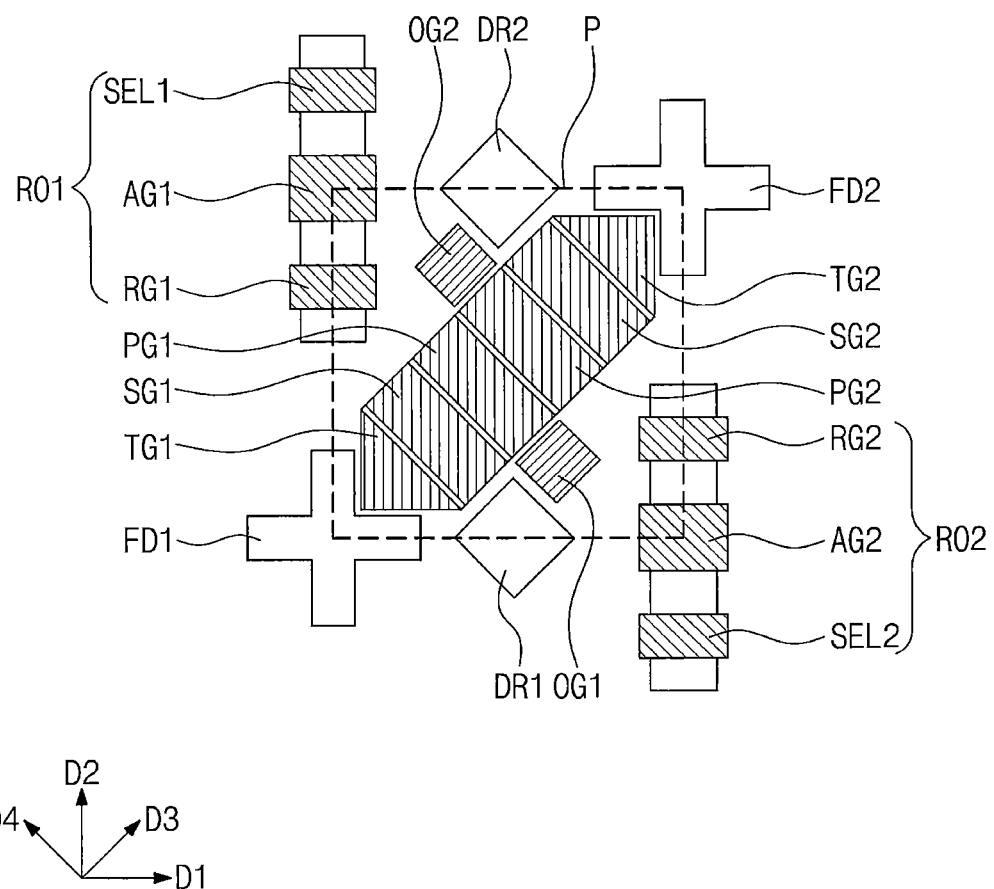

Referring to FIG. 7B, the first and second floating diffusion regions FD1 and FD2 may be spaced apart from each other in the third direction D3, and the first and second photo gate electrodes PG1 and PG2 may be spaced apart from each other in the third direction D3 and may be between the first and second floating diffusion regions FD1 and FD2. The first transfer gate electrode TG1 and a first storage gate electrode SG1 may be provided between the first floating diffusion region FD1 and the first photo gate electrode PG1. The second transfer gate electrode TG2 and a second storage gate electrode SG2 may be provided between the second floating diffusion region FD2 and the second photo gate electrode PG2.

Figure 7C:
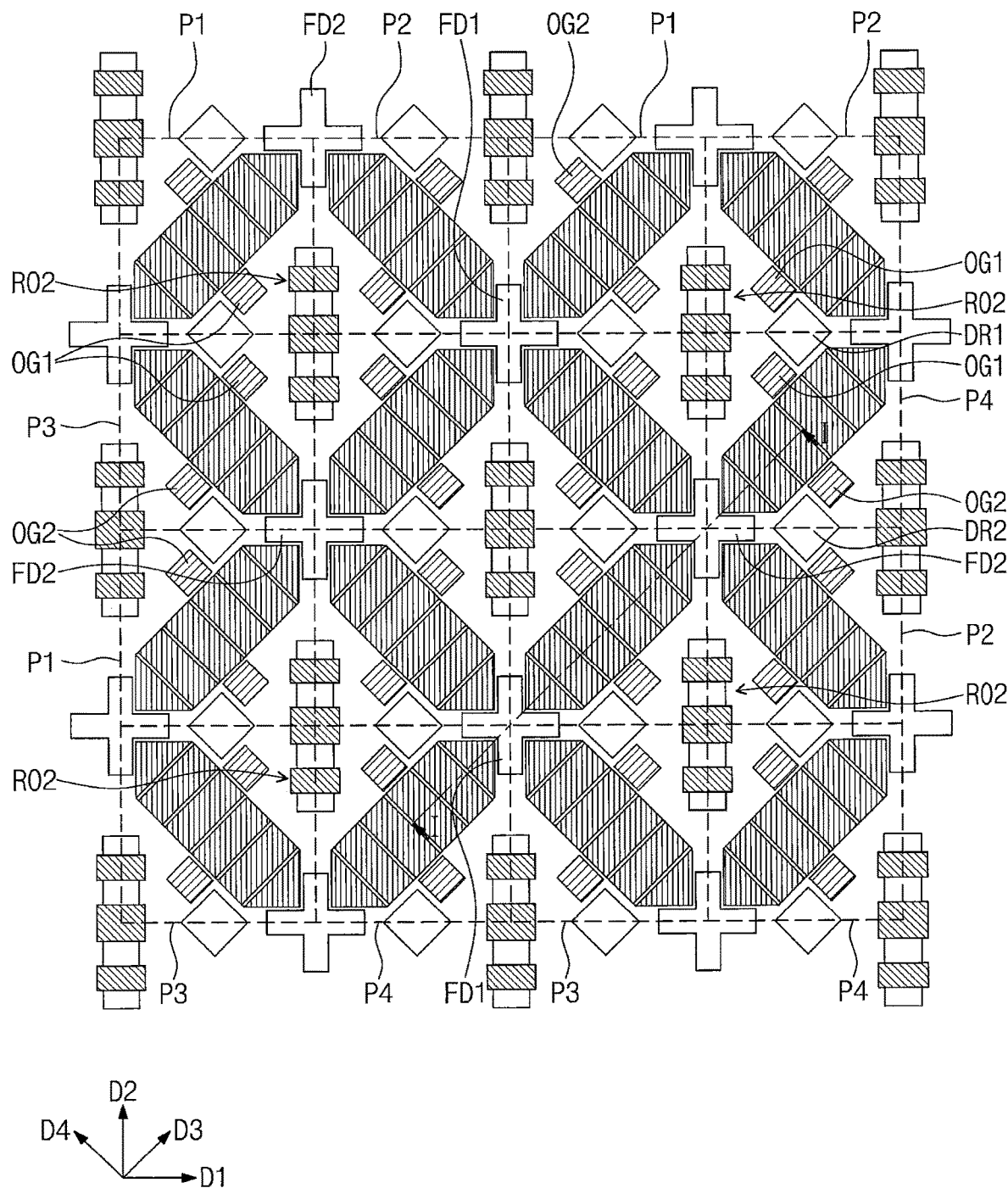
Figure 7D:
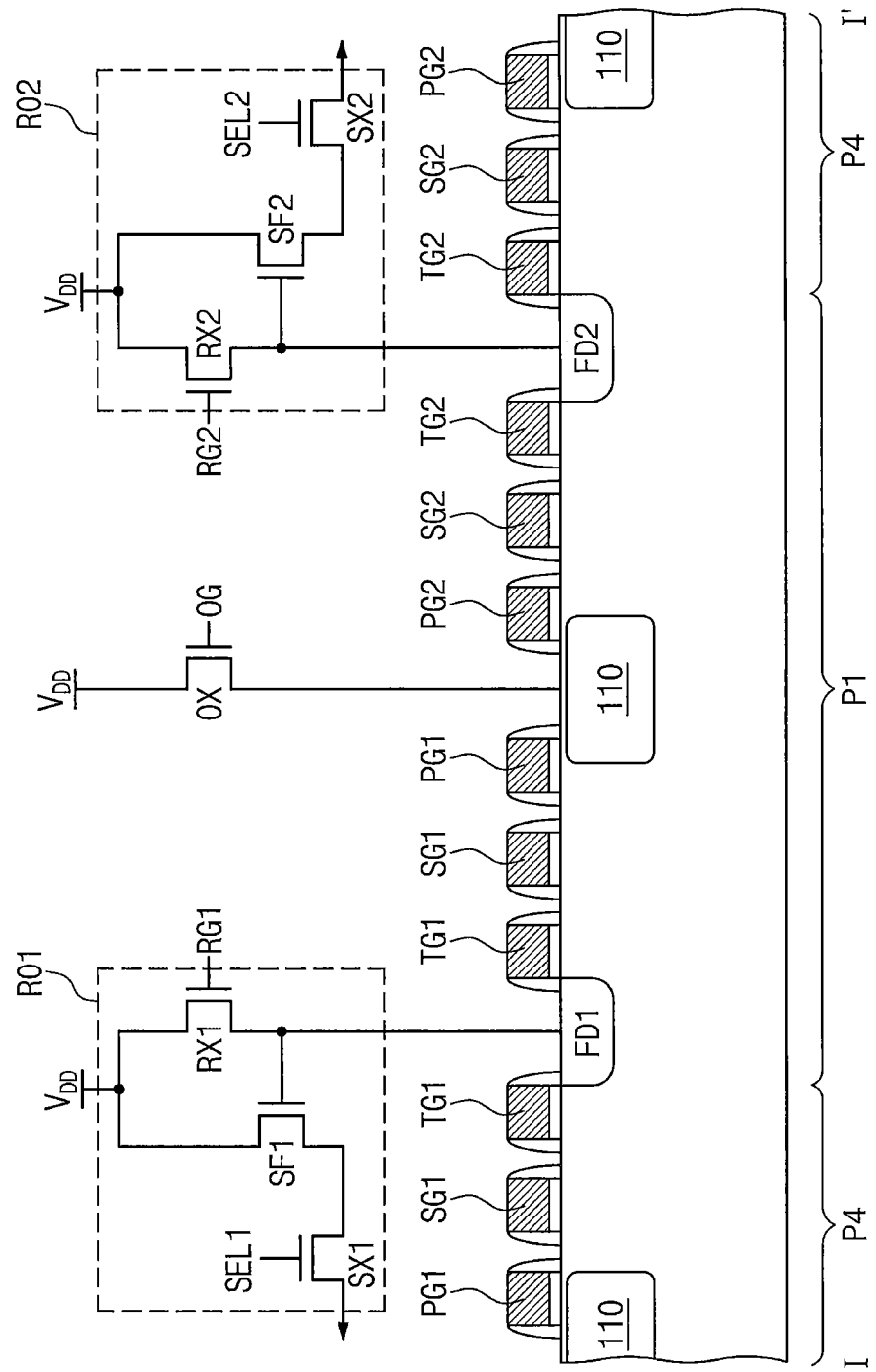

Referring to FIGS. 7C and 7D, the pixel array 10 of the image sensor may include a plurality of the unit pixels P1, P2, P3, and P4, which are arranged in the first direction D1 and the second direction D2, and the first direction D1 and the second direction D2 may be perpendicular to each other. Here, each of the unit pixels P1-P4 may be configured to have the same features as the unit pixel P described with reference to FIGS. 7A and 7B.

The pixel array 10 may include the first to fourth unit pixels P1-P4, which are mirror-symmetric in the first direction D1 and the second direction D2, as described above.

In detail, each of the first and second floating diffusion regions FD1 and FD2 may be disposed between the first or second transfer gate electrodes TG1 or TG2 of the first to fourth unit pixels P1-P4 adjacent to each other.

In each of the first to fourth unit pixels P1-P4, the first overflow gate electrode OG1 may be disposed adjacent to the first photo gate electrode PG1, and the second overflow gate electrode OG2 may be disposed adjacent to the second photo gate electrode PG2.

The first and second unit pixels P1 and P2 may be mirror-symmetrically and alternately arranged in the first direction D1. Similarly, the third and fourth unit pixels P3 and P4 may be mirror-symmetrically and alternately arranged in the first direction D1.

The first and third unit pixels P1 and P3 may be mirror-symmetrically and alternately arranged in the second direction D2, and the second and fourth unit pixels P2 and P4 may be mirror-symmetrically and alternately arranged in the second direction D2. A common impurity region may be disposed between adjacent ones of the first overflow gate electrodes OG1 or between adjacent ones of the second overflow gate electrodes OG2.

Figure 8A:
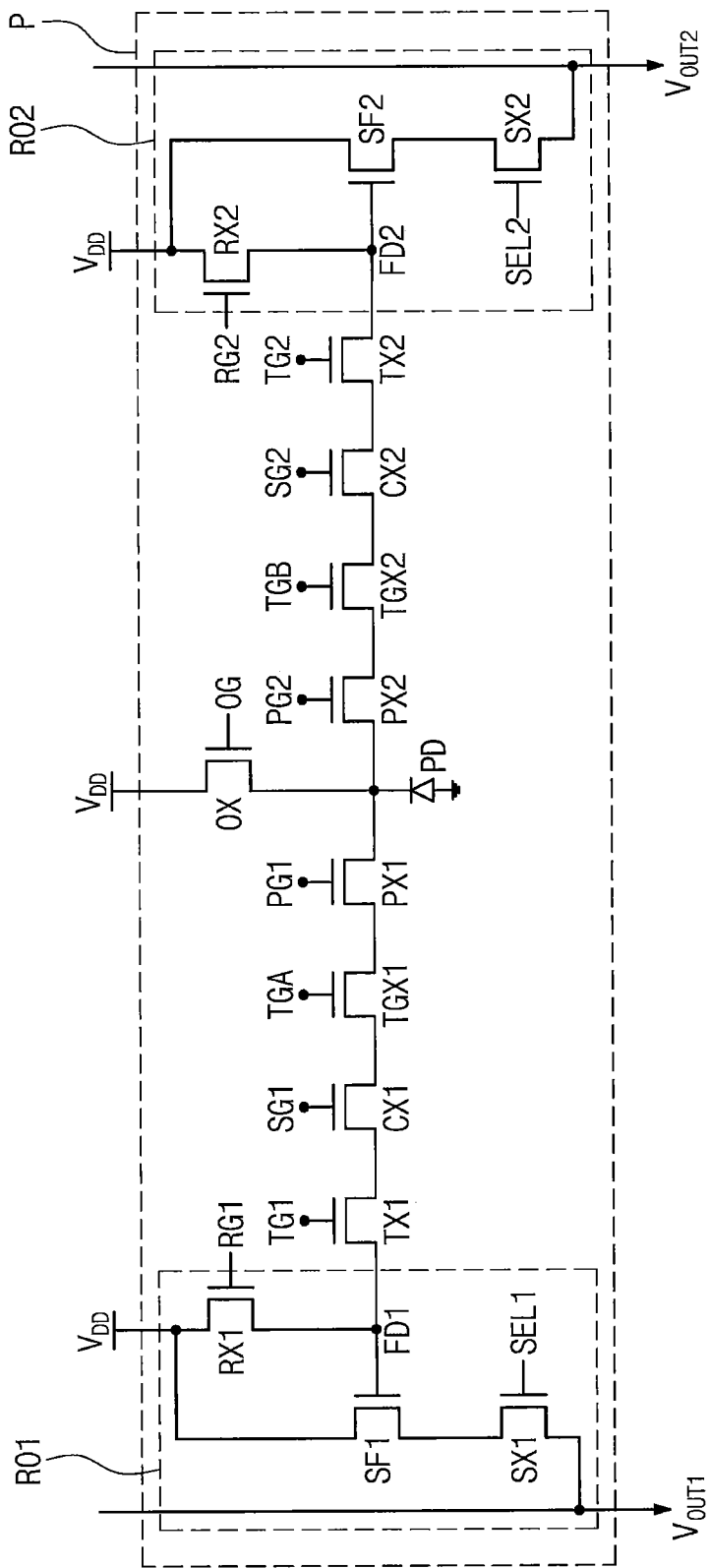

Referring to FIG. 8A, the unit pixel P may further include first and second capture transistor TGX1 and TGX2, compared with the unit pixel P described with reference to FIG. 7A. Each of the first and second capture transistors TGX1 and TGX2 may be controlled by a capture signal. The first and second capture transistors TGX1 and TGX2 may store electric charges or may transfer the electric charges to the first storage transistor CX1, according to first and second capture signals.

In detail, the first capture transistor TGX1 may be provided between and connected to the first storage transistor CX1 and the first photo transistor PX1 and may be controlled by the first capture signal. The second capture transistor TGX2 may be provided between and connected to the second storage transistor CX2 and the second photo transistor PX2 and may be controlled by the second capture signal.

The first capture transistor TGX1 may electrically connect or disconnect the first photo transistor PX1 to or from the first storage transistor CX1, in response to the first capture signal. The second capture transistor TGX2 may electrically connect or disconnect the second photo transistor PX2 to or from the second storage transistor CX2, in response to the second capture signal.

Figure 8B:
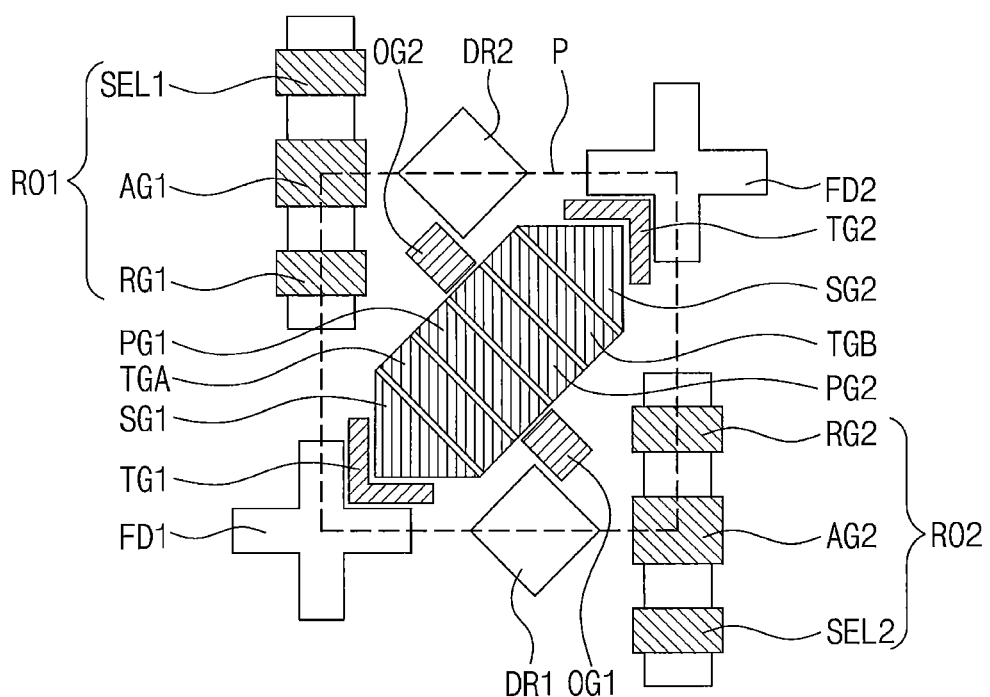

Referring to FIG. 8B, the unit pixel P may further include a first capture gate electrode TGA and a second capture gate electrode TGB, compared with the unit pixel P described with reference to FIG. 7B.

The first capture gate electrode TGA may be disposed between the first photo gate electrode PG1 and the first storage gate electrode SG1. The second capture gate electrode TGB may be disposed between the second photo gate electrode PG2 and the second storage gate electrode SG2.

Referring to FIG. 8B, each of the first and second transfer gate electrodes TG1 and TG2 may include a first portion extending (e.g., extending longitudinally) in the first direction D1 and a second portion extending (e.g., extending longitudinally) from an end of the first portion in the second direction D2.

In each unit pixel P, the first photo, capture, storage, and transfer gate electrodes PG1, TGA, SG1, and TG1 may be arranged to be spaced apart from each other in the third direction D3. In each unit pixel P, the first and second floating diffusion regions FD1 and FD2 may be mirror-symmetric to each other with respect to an imaginary line parallel to the fourth direction D4. Similarly, in each unit pixel P, the first photo, capture, storage, and transfer gate electrodes PG1, TGA, SG1, and TG1 may be mirror-symmetric to the second photo, capture, storage, and transfer gate electrodes PG2, TGA, SG2, and TG2, with respect to an imaginary line parallel to the fourth direction D4.

Figure 8C:
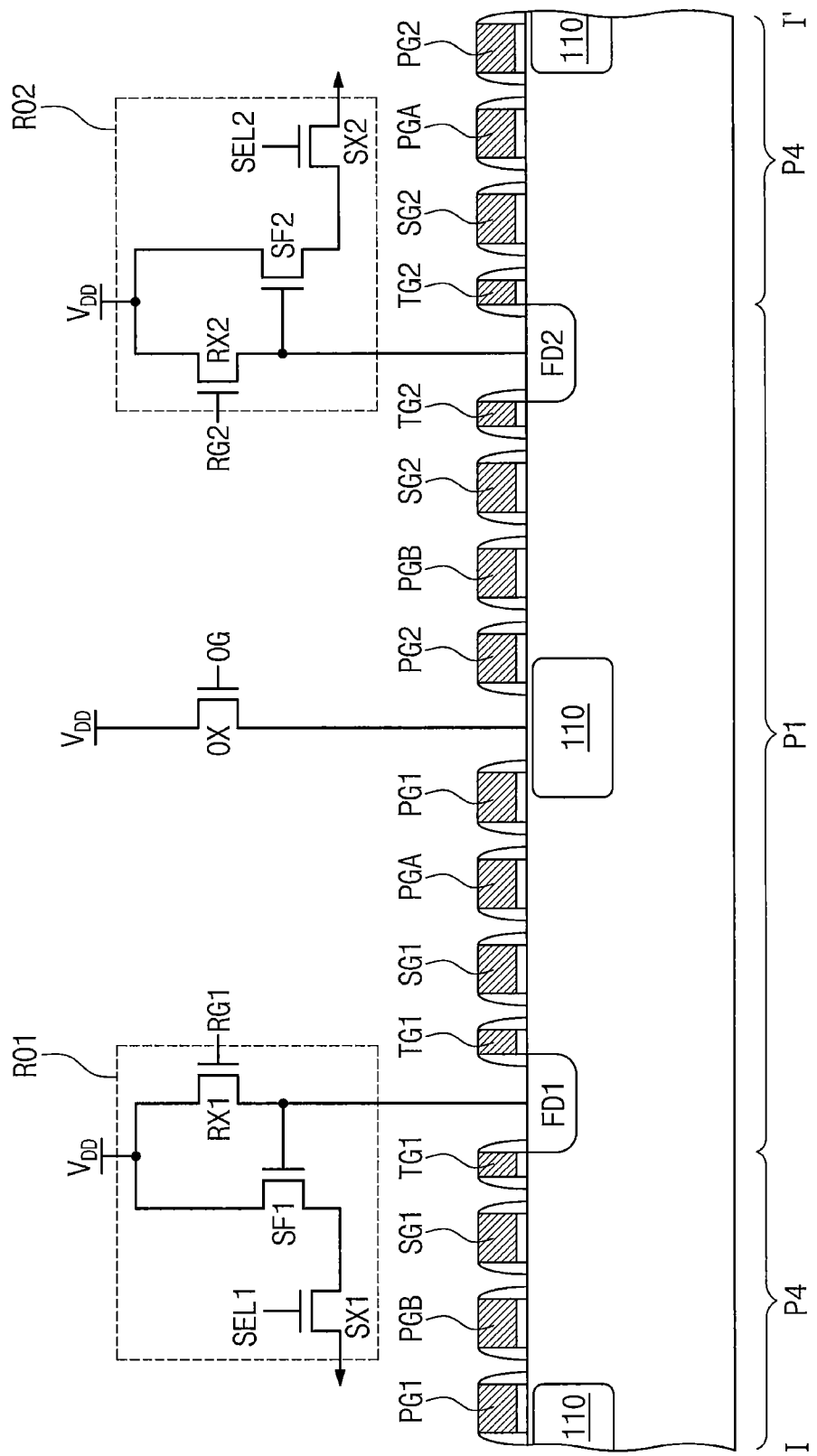
Figure 8D:
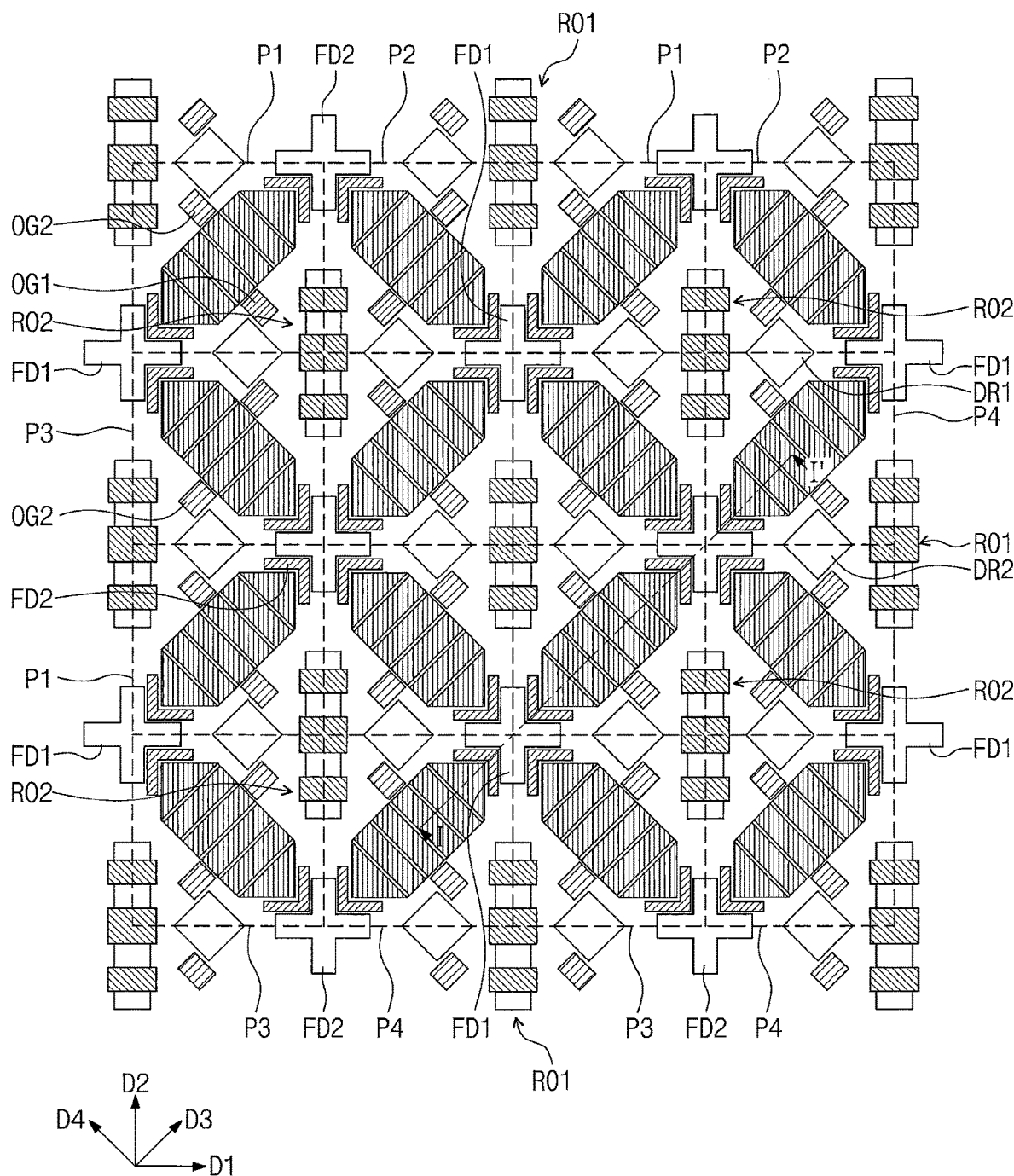

Referring to FIGS. 8C and 8D, the pixel array 10 of the image sensor may include a plurality of the unit pixels P1, P2, P3, and P4, which are arranged in the first direction D1 and the second direction D2, and the first direction D1 and the second direction D2 may be perpendicular to each other. Here, each of the unit pixels P1-P4 may be configured to have the same features as the unit pixel P described with reference to FIGS. 8A and 8B.

As described above, the first floating diffusion region FD1 may be disposed between the first transfer gate electrodes TG1 of adjacent ones of the first to fourth unit pixels P1-P4, and the second floating diffusion region FD2 may be disposed between the second transfer gate electrodes TG2 of adjacent ones of the first to fourth unit pixels P1-P4, as illustrated in FIG. 8D.

Figure 9A:
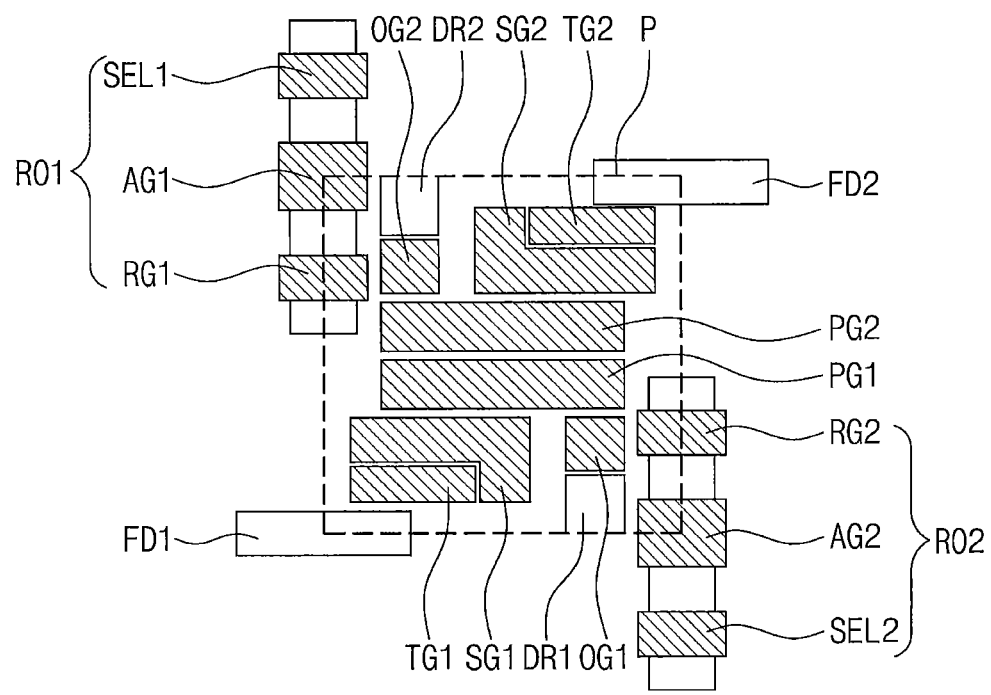
FIGS. 9A, 10A, and 11A are plan views, each of which illustrates a unit pixel of an image sensor according to some embodiments of the inventive concept.
Figure 9A:
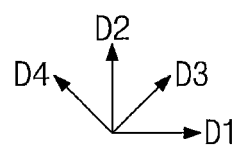
Figure 9B:
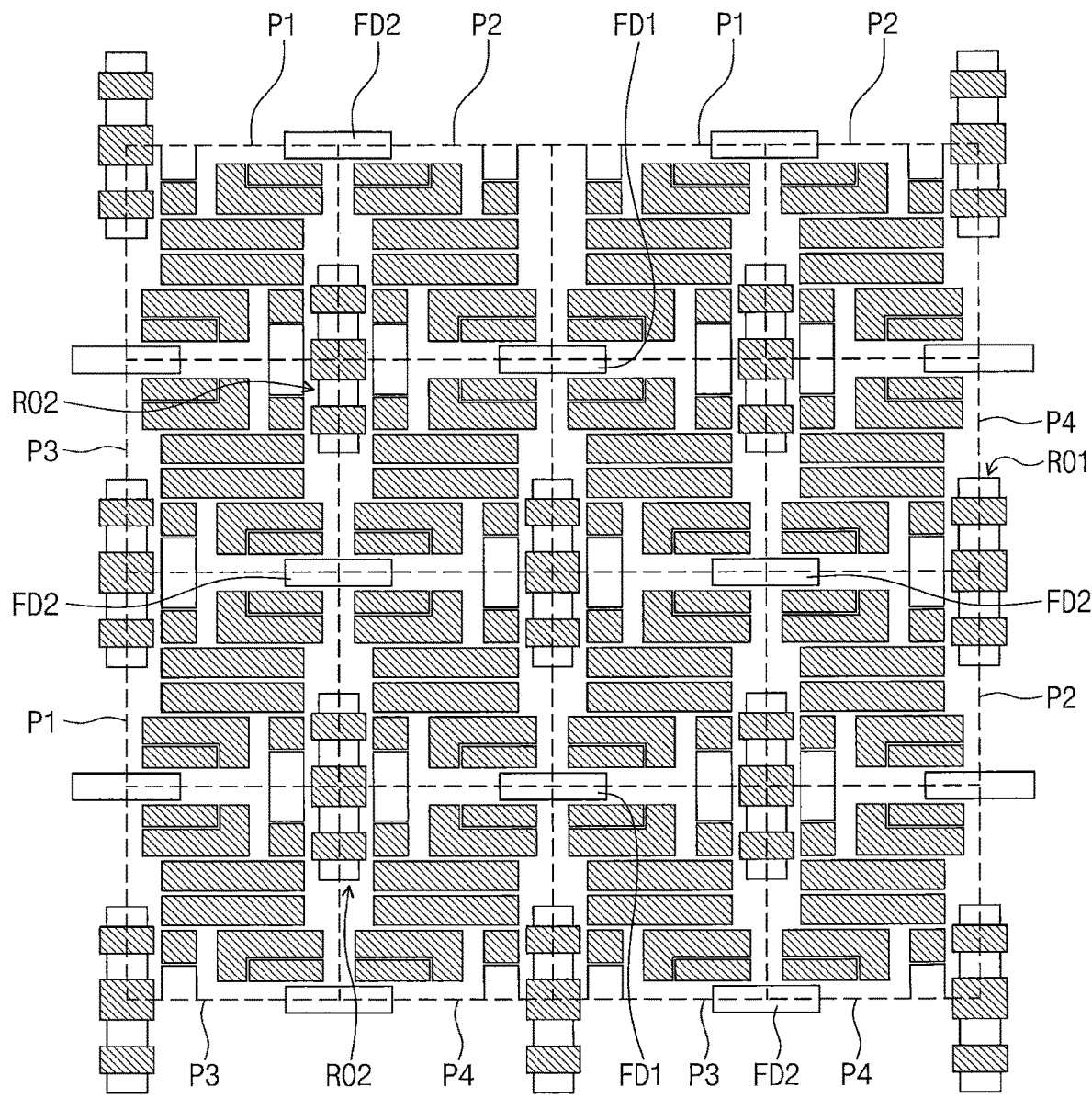
FIGS. 9B, 10B, and 11B are plan views, each of which illustrates a pixel array of an image sensor according to some embodiments of the inventive concept.
Figure 10A:
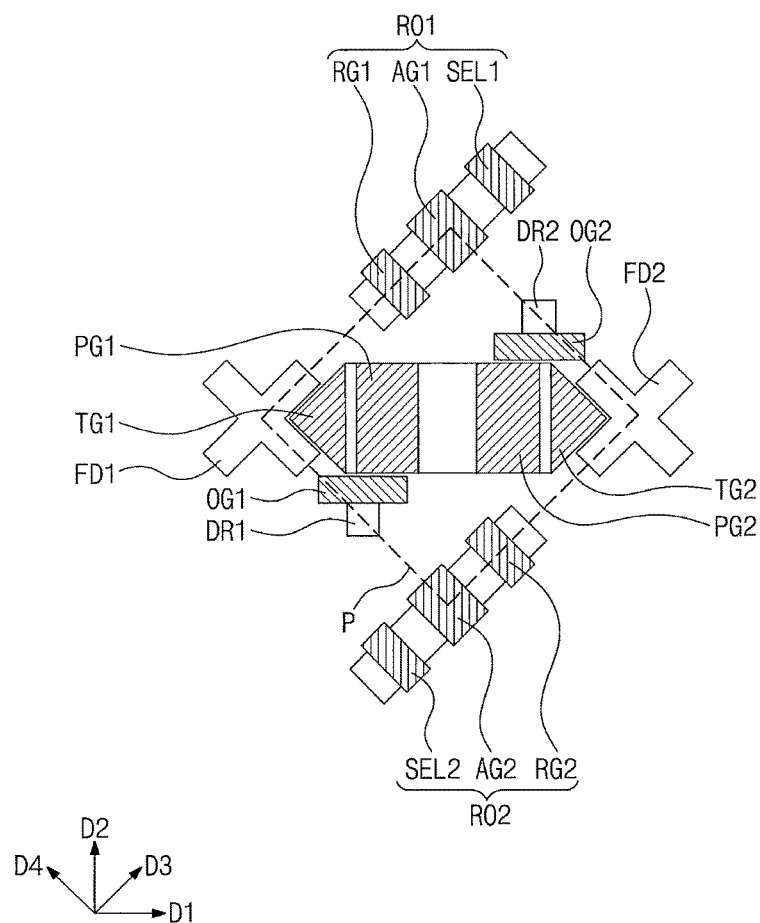
Figure 10B:
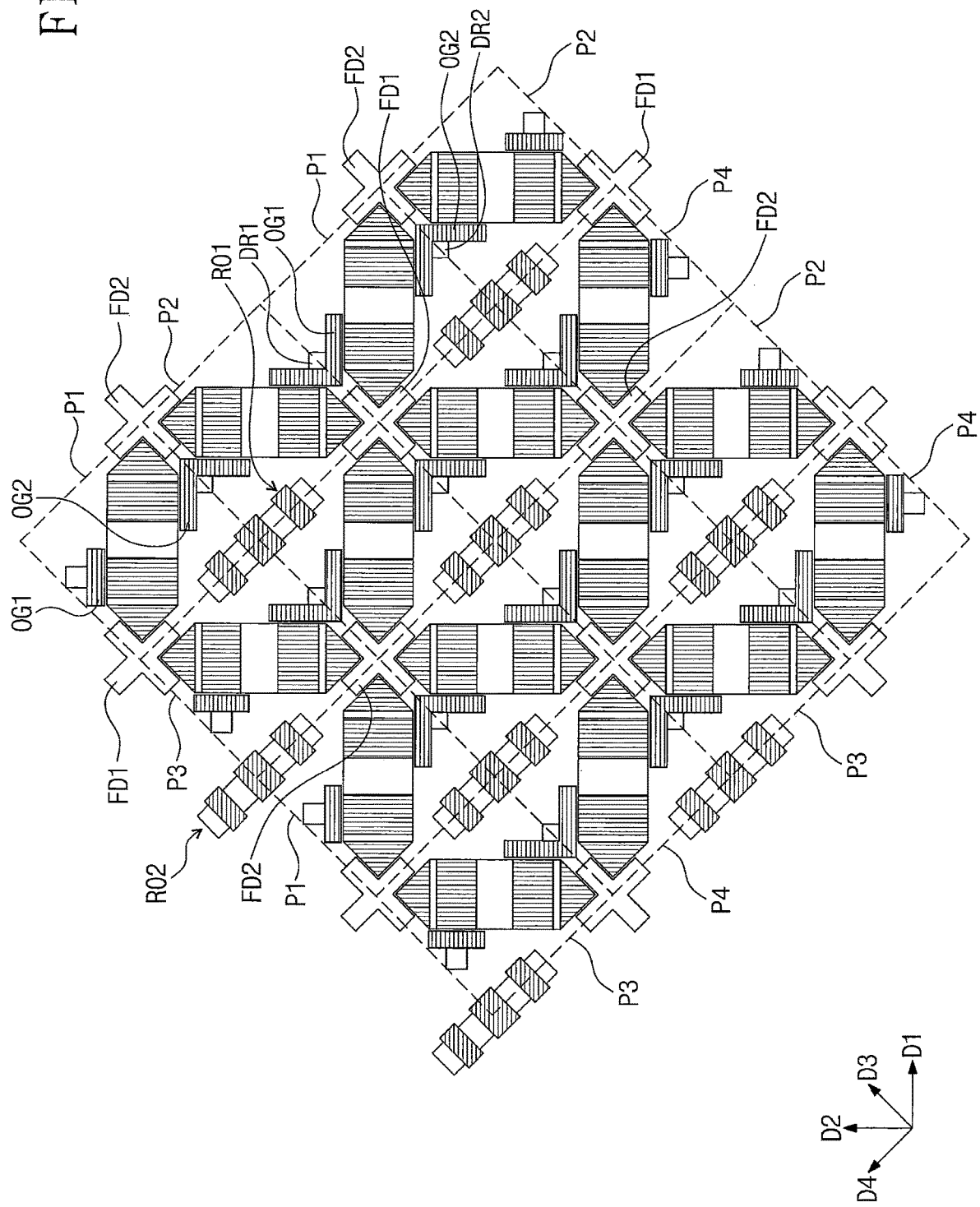
Figure 11A:
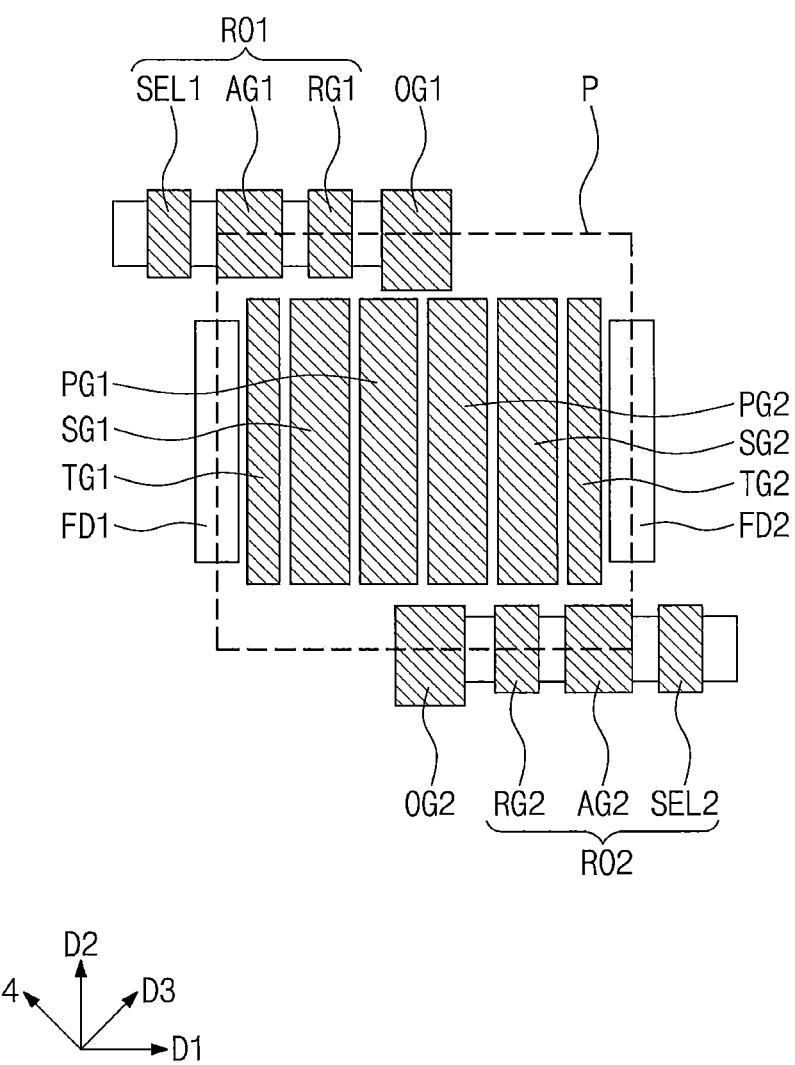
Figure 11B:
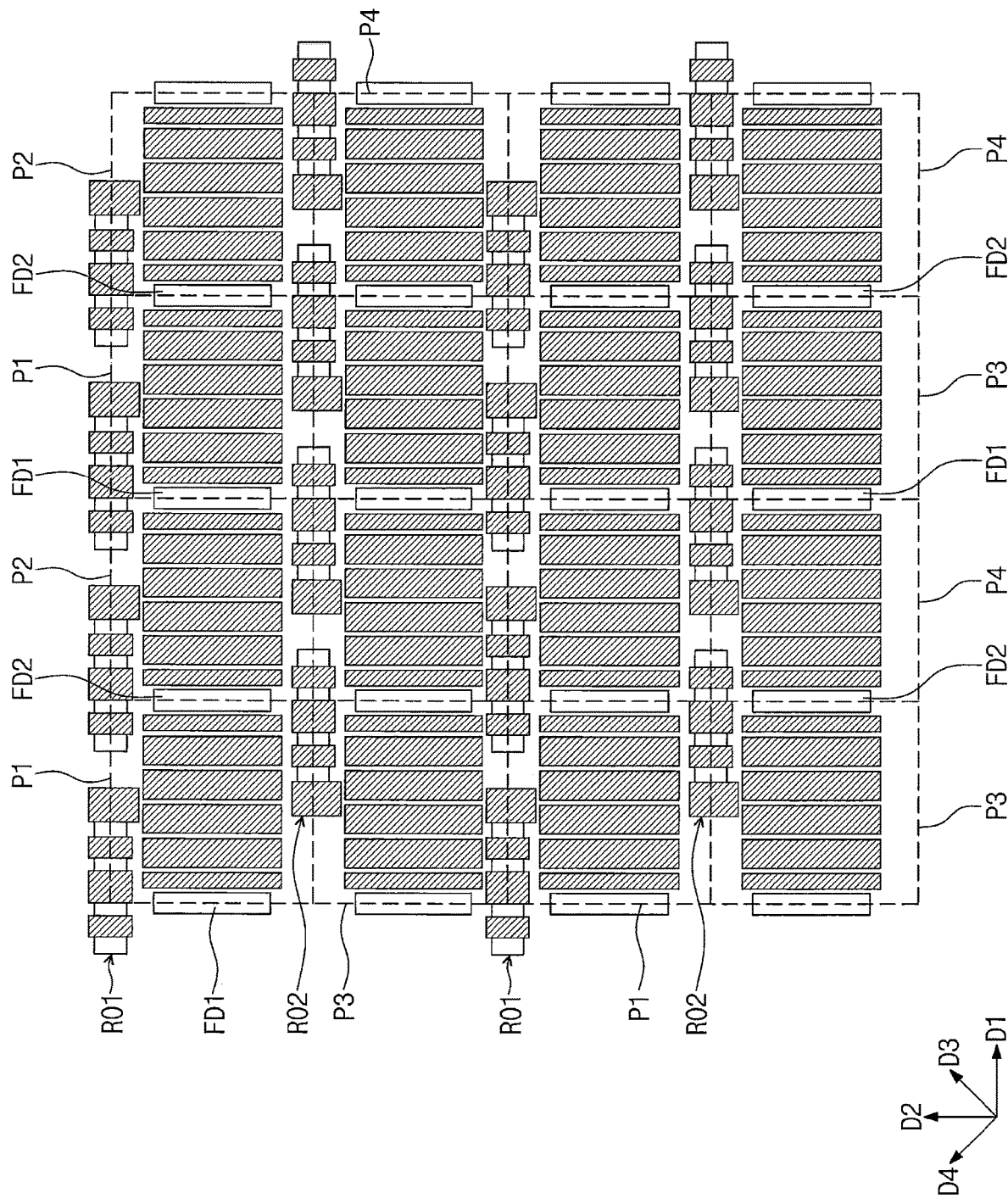

FIGS. 9A, 10A, and 11A are plan views, each of which illustrates a unit pixel of an image sensor according to some embodiments of the inventive concept. FIGS. 9B, 10B, and 11B are plan views, each of which illustrates a pixel array of an image sensor according to some embodiments of the inventive concept.

For concise description, previously described elements may be identified by a similar or identical reference number without repeating descriptions thereof.

Referring to FIGS. 9A and 9B, the unit pixel P may include the first and second photo transistors PX1 and PX2, the first and second transfer transistors TX1 and TX2, the first and second storage transistors CX1 and CX2, the first and second reset transistors RX1 and RX2, the first and second amplification transistors SF1 and SF2, and the first and second selection transistors SX1 and SX2, as previously described with reference to FIG. 7A.

Referring to FIGS. 9A and 9B, in the unit pixel P, the first and second floating diffusion regions FD1 and FD2 may be spaced apart from each other in the third direction D3, and between the first and second floating diffusion regions FD1 and FD2, the first transfer, storage, and photo gate electrodes TG1, SG1, and PG1 and the second transfer, storage, and photo gate electrodes TG2, SG2, and PG2 may be disposed in the third direction D3. In some embodiments, each of the first and second floating diffusion regions FD1 and FD2 may have a bar shape that is elongated in the first direction D1 or has a longitudinal axis parallel to the first direction D1, as illustrated in FIGS. 9A and 9B. The first transfer, storage, and photo gate electrodes TG1, SG1, and PG1 may have a rectangular shape whose long side is parallel to the first direction D1. In each of the unit pixels P, the first and second photo gate electrodes PG1 and PG2 may be symmetric to each other with respect to an imaginary line extending in the first direction D1 or the second direction D2.

As shown, when measured in the first direction D1, lengths of the first transfer and storage gate electrodes TG1 and SG1 may be smaller than that of the first photo gate electrode PG1. Similarly, when measured in the first direction D1, lengths of the second transfer and storage gate electrodes TG2 and SG2 may be smaller than that of the second photo gate electrode PG2.

The first and second overflow gate electrodes OG1 and OG2 may be disposed adjacent to the first and second photo gate electrodes PG1 and PG2, respectively. In each of the unit pixels P, the first and second overflow gate electrodes OG1 and OG2 may be spaced apart from each other in the fourth direction D4, which is different from the third direction D3. In some embodiments, the fourth direction D4 may be perpendicular to the third direction D3, as illustrated in FIG. 9A.

Referring to FIGS. 10A and 10B, the unit pixel P may include the first and second photo transistors PX1 and PX2, the first and second transfer transistors TX1 and TX2, the first and second reset transistors RX1 and RX2, the first and second amplification transistors SF1 and SF2, and the first and second selection transistors SX1 and SX2, as previously described with reference to FIG. 6A.

Referring to FIGS. 10A and 10B, in the unit pixel P, the first and second floating diffusion regions FD1 and FD2 may be spaced apart from each other in the first direction D1, and the first and second photo gate electrodes PG1 and PG2 and the first and second transfer gate electrodes TG1 and TG2 may be arranged in the first direction D1. In addition, the first and second readout circuits RO1 and RO2 may be spaced apart from each other in the second direction D2, and here, the first reset, amplification, and selection gate electrodes RG1, AG1, and SEL1 of the first readout circuit RO1 may be spaced apart from each other in the third or fourth direction D3 or D4. Similarly, the second reset, amplification, and selection gate electrodes RG2, AG2, and SEL2 of the second readout circuit RO2 may be spaced apart from each other in the third or fourth direction D3 or D4.

Referring to FIG. 10B, in the pixel array 10, the first floating diffusion region FD1 may be disposed between the first transfer gate electrodes TG1 of four unit pixels P1-P4, and the second floating diffusion region FD2 may be disposed between the second transfer gate electrodes TG2 of four unit pixels P1-P4.

Furthermore, in the unit pixels P described with reference to FIGS. 3A, 5A, 7A, and 8A, the first and second photo gate electrodes PG1 and PG2 and the first and second floating diffusion regions FD1 and FD2 may be arranged in the first direction D1 or the second direction D2.

Referring to FIGS. 11A and 11B, in the unit pixel P, the first and second floating diffusion regions FD1 and FD2 may be spaced apart from each other in the first direction D1. In some embodiments, the first and second floating diffusion regions FD1 and FD2 may have a bar shape that is elongated in the second direction D2 or has a longitudinal axis parallel to the second direction D2, as illustrated in FIGS. 11A and 11B.

The first and second photo gate electrodes PG1 and PG2, the first and second storage gate electrodes SG1 and SG2, and the first and second transfer gate electrodes TG1 and TG2 may be arranged in the first direction D1 and may have a bar shape whose longitudinal axis is parallel to the second direction D2. In some embodiments, each of the gate electrodes PG1, PG2, SG1, SG2, TG1, and TG2 of the unit pixel P may have a uniform length in the second direction D2. In some embodiments, the gate electrodes PG1, PG2, SG1, SG2, TG1, and TG2 of the unit pixel P may have the same length in the second direction D2, as illustrated in FIG. 11A.

The first and second readout circuits RO1 and RO2 may be spaced apart from each other in the third or fourth direction D3 or D4. In each of the first and second readout circuits RO1 and RO2, the gate electrodes RG1, AG1, SEL1, RG2 AG2, and SEL2 may be spaced apart from each other in the first direction D1.

Referring to FIG. 11B, in the pixel array 10, the first floating diffusion region FD1 may be disposed between the first transfer gate electrodes TG1 of two adjacent ones of the first and second unit pixels P1 and P2 or between two adjacent ones of the third and fourth unit pixels P3 and P4. The second floating diffusion region FD2 may be disposed between the second transfer gate electrodes TG2 of two adjacent ones of the first and second unit pixels P1 and P2.

The first or second readout circuit RO1 or RO2 may be disposed between the first and third unit pixels P1 and P3 adjacent to each other in the second direction D2 and between the second and fourth unit pixels P2 and P4 adjacent to each other in the second direction D2.

According to some embodiments of the inventive concept, unit pixels may be mirror-symmetrically arranged in first and second directions, and adjacent ones of the unit pixels may share a floating diffusion region. This may make it possible to increase an integration density of the image sensor.

While example embodiments of the inventive concept have been particularly shown and described, it will be understood by one of ordinary skill in the art that variations in form and detail may be made therein without departing from the spirit and scope of the attached claims.

What is claimed is:

1. An image sensor comprising:
    a plurality of unit pixels arranged in a first direction and a second direction crossing the first direction,
    wherein each of the plurality of unit pixels comprises:
        first and second floating diffusion regions on opposing first corners of the each of the plurality of unit pixels, respectively, the opposing first corners being spaced apart from each other in a third direction that is different from the first and second directions;
        first and second readout circuits on opposing second corners of the each of the plurality of unit pixels, respectively, the opposing second corners being spaced apart from each other in a fourth direction that is perpendicular to the third direction; and
        first and second photo gate electrodes between the first and second floating diffusion regions,
    wherein the plurality of unit pixels comprise a first unit pixel, a second unit pixel, and a third unit pixel sequentially arranged, and the second unit pixel is between the first unit pixel and the third unit pixel,
    wherein the first floating diffusion region of the second unit pixel is between the first photo gate electrode of the first unit pixel and the first photo gate electrode of the second unit pixel, and
    wherein the second floating diffusion region of the second unit pixel is between the second photo gate electrode of the second unit pixel and the second photo gate electrode of the third unit pixel.

2. The image sensor of claim 1,
wherein the first and second photo gate electrodes of the second unit pixel are spaced apart from each other in the third direction.

3. The image sensor of claim 2, wherein the first and second photo gate electrodes of the second unit pixel are mirror-symmetric to each other with respect to an imaginary line extending in the fourth direction.

4. The image sensor of claim 1,
wherein the first readout circuit is electrically connected to the first floating diffusion region, and
the second readout circuit is electrically connected to the second floating diffusion region.

5. The image sensor of claim 1, wherein each of the plurality of unit pixels further comprises:
a first transfer gate electrode between the first photo gate electrode and the first floating diffusion region; and
a second transfer gate electrode between the second photo gate electrode and the second floating diffusion region.

6. The image sensor of claim 1, wherein the second unit pixel is directly adjacent to the first unit pixel and the third unit pixel,
wherein the first floating diffusion region of the first unit pixel and the first floating diffusion region of the second unit pixel comprise a first portion and a second portion of a shared first floating diffusion region, and
wherein the second floating diffusion region of the second unit pixel and the second floating diffusion region of the third unit pixel comprise a first portion and a second portion of a shared second floating diffusion region.

7. The image sensor of claim 6, wherein the plurality of unit pixels further comprises a fourth unit pixel that is directly adjacent to the second unit pixel, and
wherein the first floating diffusion region of the fourth unit pixel comprises a third portion of the shared first floating diffusion region.

8. An image sensor comprising:
a plurality of unit pixels arranged in a first direction and a second direction crossing the first direction,
wherein each of the plurality of unit pixels comprises:
first and second floating diffusion regions on opposing first corners of the each of the plurality of unit pixels, respectively, the opposing first corners being spaced apart from each other in a third direction that is diagonal to the first and second directions;
first and second readout circuits on opposing second corners of the each of the plurality of unit pixels, respectively, the opposing second corners being spaced apart from each other in a fourth direction that is perpendicular to the third direction; and
first and second photo gate electrodes between the first and second floating diffusion regions, the first and second photo gate electrodes being spaced apart from each other in the third direction.

9. The image sensor of claim 8, wherein the first and second floating diffusion regions of the plurality of unit pixels are arranged in an alternating sequence along the third direction.

10. The image sensor of claim 8,
wherein the first readout circuit is electrically connected to the first floating diffusion region, and
the second readout circuit is electrically connected to the second floating diffusion region.

11. The image sensor of claim 10, wherein the first readout circuits of the plurality of unit pixels are spaced apart from each other in the first direction, and one of the first and second floating diffusion regions is between two of the first readout circuits that are directly adjacent to each other in the first direction.

12. The image sensor of claim 8, wherein each of the plurality of unit pixels further comprises:
a first transfer gate electrode between the first photo gate electrode and the first floating diffusion region; and
a second transfer gate electrode between the second photo gate electrode and the second floating diffusion region.

13. The image sensor of claim 8, wherein the plurality of unit pixels comprise:
a first unit pixel;
a second unit pixel that is directly adjacent to the first unit pixel in the first direction, the first and second unit pixels being mirror-symmetric with respect to a first imaginary line extending in the second direction; and
a third unit pixel that is directly adjacent to the first unit pixel in the second direction, the first and third unit pixels being mirror-symmetric with respect to a second imaginary line extending in the first direction.

14. The image sensor of claim 8, wherein the plurality of unit pixels comprises a first unit pixel and a second unit pixel that is directly adjacent to the first unit pixel in the third direction, and
wherein the first floating diffusion region of the first unit pixel and the first floating diffusion region of the second unit pixel comprise a first portion and a second portion of a shared first floating diffusion region.

15. The image sensor of claim 14, wherein the plurality of unit pixels further comprises a third unit pixel that is directly adjacent to the second unit pixel in the third direction, and the second unit pixel is between the first unit pixel and the third unit pixel, and
wherein the second floating diffusion region of the second unit pixel and the second floating diffusion region of the third unit pixel comprise a first portion and a second portion of a shared second floating diffusion region.

16. An image sensor comprising:
a plurality of unit pixels arranged in a first direction and a second direction crossing the first direction,
wherein each of the plurality of unit pixels comprises:
first and second floating diffusion regions spaced apart from each other in a third direction that is diagonal to the first and second directions;
first and second photo gate electrodes between the first and second floating diffusion regions, the first and second photo gate electrodes being spaced apart from each other in the third direction; and
first and second readout circuits spaced apart from each other in a fourth direction that is perpendicular to the third direction, and
wherein the plurality of unit pixels comprise a first unit pixel, a second unit pixel, and a third unit pixel, the second unit pixel is directly adjacent to the first unit pixel in the first direction, and the third unit pixel is directly adjacent to the first unit pixel in the second direction,
wherein the first and second unit pixels are mirror-symmetric to each other with respect to a first imaginary line extending in the second direction, and
wherein the first and third unit pixels are mirror-symmetric to each other with respect to a second imaginary line extending in the first direction.

17. The image sensor of claim 16, wherein the first floating diffusion region of the first unit pixel, the first floating diffusion region of the second unit pixel, and the first floating diffusion region of the third unit pixel comprise a first portion, a second portion, and a third portion of a shared first floating diffusion region, respectively, and wherein the shared first floating diffusion region is between the first photo gate electrode of the first unit pixel and the first photo gate electrode of the second unit pixel and is between the first photo gate electrode of the first unit pixel and the first photo gate electrode of the third unit pixel.

18. The image sensor of claim 16, wherein:

the first readout circuit is electrically connected to the first floating diffusion region; and the second readout circuit is electrically connected to the second floating diffusion region.

19. The image sensor of claim 16, wherein the first floating diffusion region of the first unit pixel and the first floating diffusion region of the second unit pixel comprise a first portion and a second portion of a shared first floating diffusion region, respectively, and wherein the first imaginary line passes through a center of the shared first floating diffusion region in the first direction.

\* \* \* \* \*